US007884368B2

(12) United States Patent
Ishizaki et al.

(10) Patent No.: US 7,884,368 B2
(45) Date of Patent: Feb. 8, 2011

(54) THIN FILM TRANSISTOR, METHOD FOR MANUFACTURING THE SAME AND DISPLAY USING THE SAME

(75) Inventors: Mamoru Ishizaki, Tokyo (JP); Manabu Ito, Tokyo (JP); Masato Kon, Tokyo (JP); Osamu Kina, Tokyo (JP); Ryohei Matsubara, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 12/833,822

(22) Filed: Jul. 9, 2010

(65) Prior Publication Data

US 2010/0276692 A1 Nov. 4, 2010

Related U.S. Application Data

(63) Continuation of application No. 11/985,235, filed on Nov. 13, 2007, now Pat. No. 7,768,008.

(51) Int. Cl.
*H01L 33/00* (2010.01)
(52) U.S. Cl. .............................. 257/59; 257/71; 257/24; 257/E21.001; 438/30
(58) Field of Classification Search .................. 257/59, 257/24, 71, E33.01, E21.001; 438/30
See application file for complete search history.

(56) References Cited

U.S. PATENT DOCUMENTS 7,145,174 B2 * 12/2006 Chiang et al. ................. 257/59

* cited by examiner

*Primary Examiner*—Thinh T Nguyen
(74) *Attorney, Agent, or Firm*—Squire, Sanders & Dempsey L.L.P.

(57) ABSTRACT

One embodiment of the present invention is a thin film transistor having a gate electrode formed on an insulating substrate, a gate wire connected to the gate electrode, a capacitor electrode, a capacitor wire connected to the capacitor electrode, a gate insulator formed on the gate electrode, an oxide semiconductor pattern formed on the gate insulator, a sealing layer formed on the oxide semiconductor pattern, a drain electrode and a source electrode formed on the sealing layer, a drain wire connected to the drain electrode and a pixel electrode connected to the source electrode, the drain wire and the pixel electrode being in the same layer as the drain electrode and the source electrode. Wherein the gate wire, the capacitor electrode and the capacitor wire are in the same layer as the gate electrode, and wherein the sealing layer does not cover a connection part of the source electrode and a connection part of the drain electrode and wherein the drain electrode and the source electrode are connected to the oxide semiconductor pattern via the connection part of the drain electrode and the connection part of the source electrode.

8 Claims, 21 Drawing Sheets

(A)

(B)

(A)

(B)

(A)

(B)

(A)

(B)

THIN FILM TRANSISTOR, METHOD FOR MANUFACTURING THE SAME AND DISPLAY USING THE SAME

CROSS REFERENCE TO RELATED APPLICATIONS

This is a continuation application of application Ser. No. 11/985,235 filed on Nov. 13, 2007 (now pending), the entire contents of which are incorporated herein by reference.

BACKGROUND OF THE INVENTION

1. Field of the Invention

The present invention is related to a thin film transistor used for various image display devices and to a method for manufacturing the thin film transistor. Further, the present invention is related to a display using the thin film transistor.

2. Description of the Related Art

Conventionally, using a transistor which uses a semiconductor for a substrate and IC technology as a basis, a thin film transistor (TFT) having amorphous silicon (a-Si) or poly silicon (poly-Si) is formed on a glass substrate. Such a thin film transistor is used for a liquid crystal display, electronic paper and an electroluminescence display.

In addition, in recent years, an organic semiconductor or an oxide semiconductor has been developed. (See non-patent document 1.) That is, it was found that TFT could be manufactured at a low temperature of 200□ or less. Therefore, a flexible display using a plastic substrate is expected. Particularly, since mobility of the oxide semiconductor is high (about 10 cm$^2$/Vs), it is expected that a high performance TFT like poly-Si is realized. That is, it is expected that TFT having the oxide semiconductors are used not only for TFT inside a pixel but also for a circumferentially-arranged drive logic circuit.

However, in a manufactured oxide TFT, the threshold voltage of TFT was shifted when the oxide semiconductor came into contact with general resin (epoxy, acrylic or the like), wherein the shift amount was about (−30) V.

This shift phenomenon becomes a problem not only when the thin film transistor is used as a logic circuit but also when the thin film transistor is used for a display. For example, when the thin film transistor is used as a logic circuit, the thin film transistor is usually buried by an epoxy resin. However, when the oxide semiconductor comes into contact with this epoxy, the characteristics of TFT change, thereby a normal logic operation is not conducted.

In addition, when the thin film transistor is used for a display wherein an interlayer dielectric and an upper pixel electrode are formed, the oxide semiconductor comes into contact with a resin such as epoxy or acrylic which is usually used for the interlayer dielectric, thereby the characteristics of TFT change. When the thin film transistor is used for a display wherein an interlayer dielectric is not formed, the oxide semiconductor comes into contact with a liquid crystal in a case of a liquid crystal display, or the oxide semiconductor comes into contact with an adhesive in a case of electronic paper, thereby the characteristics of TFT change. In whichever case, behavior of a display device becomes abnormal.

[non-patent document] K. Nomura et al., Nature, 432, 488 (2004)

SUMMARY OF THE INVENTION

One embodiment of the present invention is a thin film transistor having a gate electrode formed on an insulating substrate, a gate wire connected to the gate electrode, a capacitor electrode, a capacitor wire connected to the capacitor electrode, a gate insulator formed on the gate electrode, an oxide semiconductor pattern formed on the gate insulator, a sealing layer formed on the oxide semiconductor pattern, a drain electrode and a source electrode formed on the sealing layer, a drain wire connected to the drain electrode and a pixel electrode connected to the source electrode, the drain wire and the pixel electrode being in the same layer as the drain electrode and the source electrode. and wherein the gate wire, the capacitor electrode and the capacitor wire are in the same layer as the gate electrode, wherein the sealing layer does not cover a connection part of the source electrode and a connection part of the drain electrode and wherein the drain electrode and the source electrode are connected to the oxide semiconductor pattern via the connection part of the drain electrode and the connection part of the source electrode.

Figure 1:
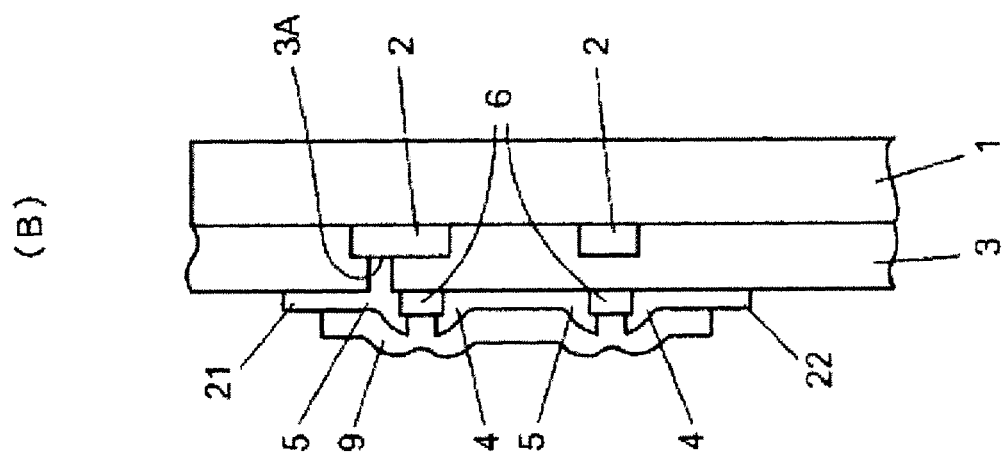
FIGS. 1 (A), (B) are a plan view and a cross-sectional view of one example in the first embodiment of a thin film transistor of the present invention.
Figure 1:
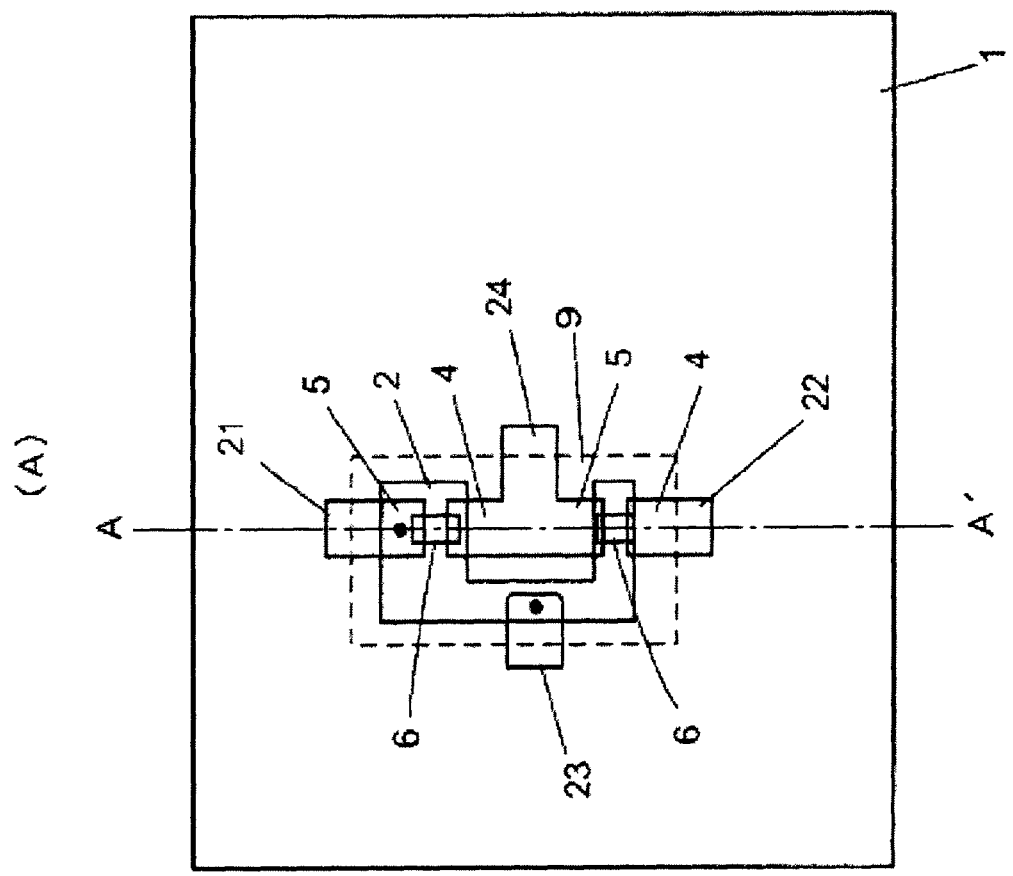

In these drawings, 1 is an insulating substrate; 2 is a gate electrode; 2' is a gate wire; 3 is a gate insulator; 3A is an opening of a gate insulator; 3AR is a resist used for forming an opening of a gate insulator; 4 is a source electrode; 5 is a drain electrode; 6 is an oxide semiconductor pattern; 6L is an oxide semiconductor layer; 6R is a resist for patterning an oxide semiconductor; 7 is an interlayer dielectric; 7A is an opening of an interlayer dielectric; 8 is a pixel electrode; 9 is a sealing layer; 9A is an opening of a sealing layer; 10 is a capacitor electrode; 10' is a capacitor wire; 12 is an upper pixel electrode; 13 is a counter electrode; 14 is a counter electrode; 15 is a liquid crystal; 16 is an electrophoretic capsule; 17 is a black matrix; 18 is an adhesive; 21 is a power source electrode; 22 is a ground electrode; 23 is an input electrode; and 24 is an output electrode.

DESCRIPTION OF THE PREFERRED EMBODIMENTS

In order to achieve the above stated objectives, a thin film transistor of the present invention has a gate electrode formed on an insulating substrate, a gate insulator formed on the gate electrode, and a drain electrode and a source electrode formed on the gate insulator, wherein an oxide semiconductor pattern is formed between the drain electrode and the source electrode, and wherein a sealing layer is formed on the oxide semiconductor pattern. The sealing layer can control a harmful effect on the oxide semiconductor when a usually used non-fluorinated resin comes into contact with the oxide semiconductor. In particular, if a difference in the threshold voltage of a thin film transistor between before and after applying a resin on an oxide semiconductor is within ±5V, a harmful effect to an oxide semiconductor is small.

In addition, a feature of the sealing layer is that it is an inorganic insulating material. That is, an inorganic insulating material can be used as a sealing layer which does not give a harmful effect to an oxide semiconductor. In addition a feature of the sealing layer is that it is made of silicon oxide nitride. Silicon oxide nitride among inorganic insulating materials can easily become a film superior in insulating properties and sealing performance.

In addition, a thin film transistor having a sealing layer made of a fluorinated resin can be used. A fluorinated resin can be used for a layer since the fluorinated resin does not give a harmful effect to an oxide semiconductor.

In addition, a thin film transistor can have a gate wire connected to a gate electrode, a capacitor electrode and a capacitor wire connected to the capacitor electrode, these elements being in the same layer as a gate electrode. Further, a thin film transistor can have a drain wire connected to a drain electrode and a pixel electrode connected to a source electrode, these elements being in the same layer as a drain electrode and a source electrode. In this case, a sealing layer is not formed over a pixel electrode. In this configuration, the pixel electrode applies a voltage to a liquid crystal layer or to a electrophoretic capsule and the thin film transistor can thereby be used as TFT for a flexible display.

In addition, a thin film transistor can have a gate wire connected to a gate electrode, a capacitor electrode and a capacitor wire connected to the capacitor electrode, these elements being in the same layer as a gate electrode. Further, a thin film transistor can have a drain wire connected to a drain electrode and a pixel electrode connected to a source electrode, these elements being in the same layer as a drain electrode and a source electrode. In this case, a sealing layer is formed on an oxide semiconductor pattern. An interlayer dielectric has an opening which is arranged on the pixel electrode. An upper pixel electrode is connected to the pixel electrode through the opening of the interlayer dielectric. In this configuration, the upper pixel electrode applies a voltage to a liquid crystal layer or to a electrophoretic capsule and the thin film transistor can thereby be used as TFT for a flexible display.

In addition, in a display having the above-mentioned thin film transistor, a flexible display having stable characteristics can be realized.

In addition, a method for manufacturing a thin film transistor of the present invention comprises a step of forming a gate electrode on a insulating substrate, a step of forming a resist pattern at a place to be an opening of a gate insulator, a step of forming films of a gate insulator and an oxide semiconductor, a step of forming the opening of the gate insulator by removing the resist at the place to be the opening of the gate insulator, a step of forming a pattern of the oxide semiconductor before or after forming the opening, a step of forming a drain electrode and a source electrode, and a step of forming a sealing layer before or after forming the drain electrode and the source electrode, wherein, in forming the pattern of the oxide semiconductor, a part near the opening of the insulator is not etched, thereby the gate electrode in the opening is not exposed to a etchant. In this method, a material of the gate electrode can be selected from various kinds of materials.

In addition, a method for manufacturing a thin film transistor of the present invention has a step of forming a gate electrode on a insulating substrate, a step of forming a gate insulator, a step of forming an oxide semiconductor pattern, a step of forming a drain electrode and a source electrode, and a step of forming a sealing layer before or after forming the drain electrode and the source electrode, wherein the step of forming the sealing layer is a reactive sputtering. In a case where the step of forming the sealing layer is a reactive sputtering, the layer having a good performance can be obtained by a simple method with good reproducibility.

Further, a method for manufacturing a thin film transistor has a step for forming a gate electrode, a gate wire, a capacitor electrode and a capacitor wire on an insulating substrate, a step of forming a gate insulator, a step of forming an oxide semiconductor pattern, a step of forming a drain electrode, a drain wire, a source electrode and a pixel electrode, a step of forming a sealing layer before or after forming the drain electrode, the drain wire, the source electrode and the pixel electrode, a step of forming an interlayer dielectric, and a step of forming an upper pixel electrode, wherein the step of forming the upper pixel electrode is a screen printing method. In forming the upper pixel electrode, a screen printing method is used and a thin film transistor can thereby be manufactured by a simple process.

Hereinafter, some embodiments of the present invention are described in detail by referring to the drawings.

The First Embodiment

Figure 2:
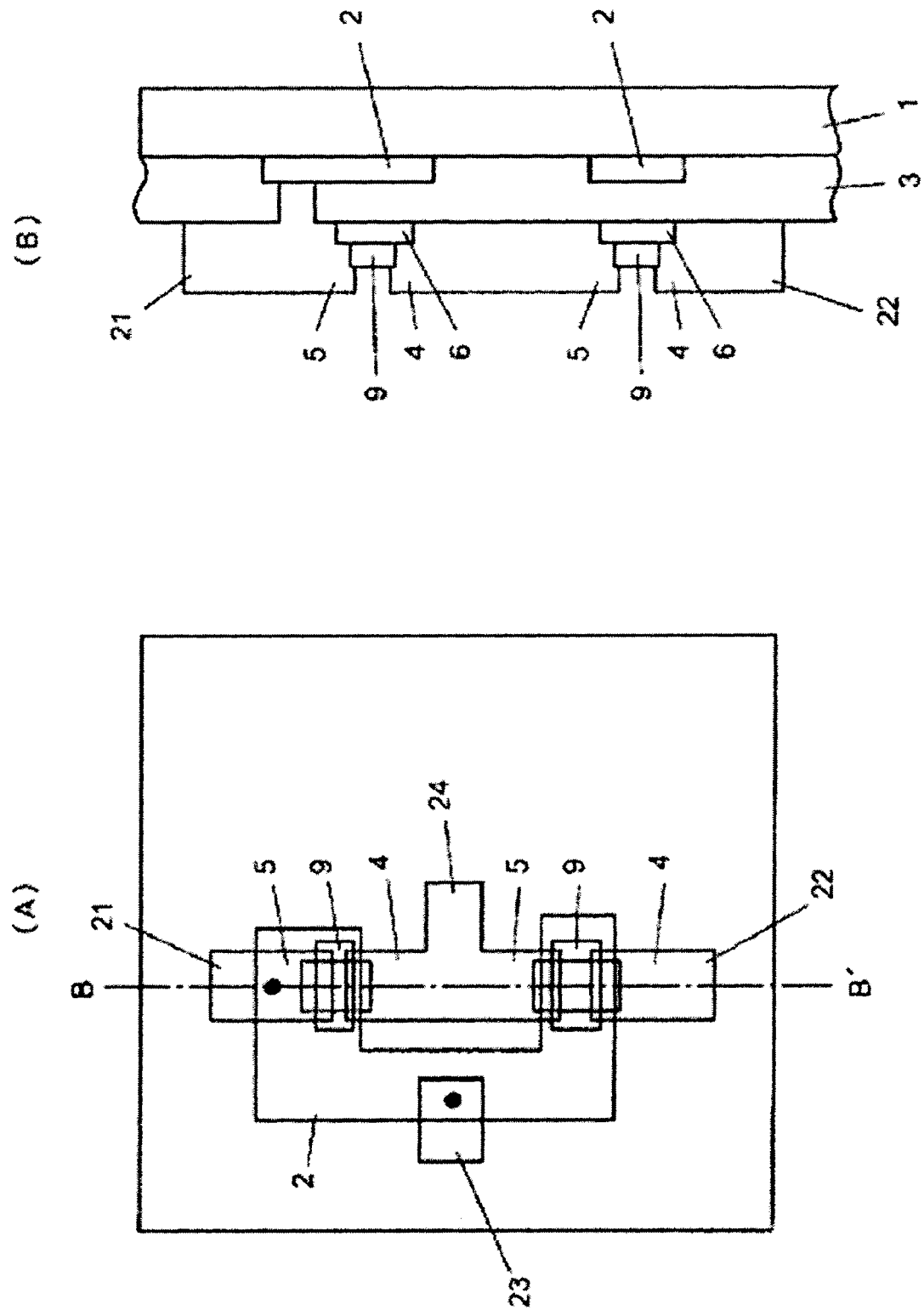
FIGS. 2 (A), (B) are a plan view and a cross-sectional view of another example in the first embodiment of a thin film transistor of the present invention.
Figure 3:
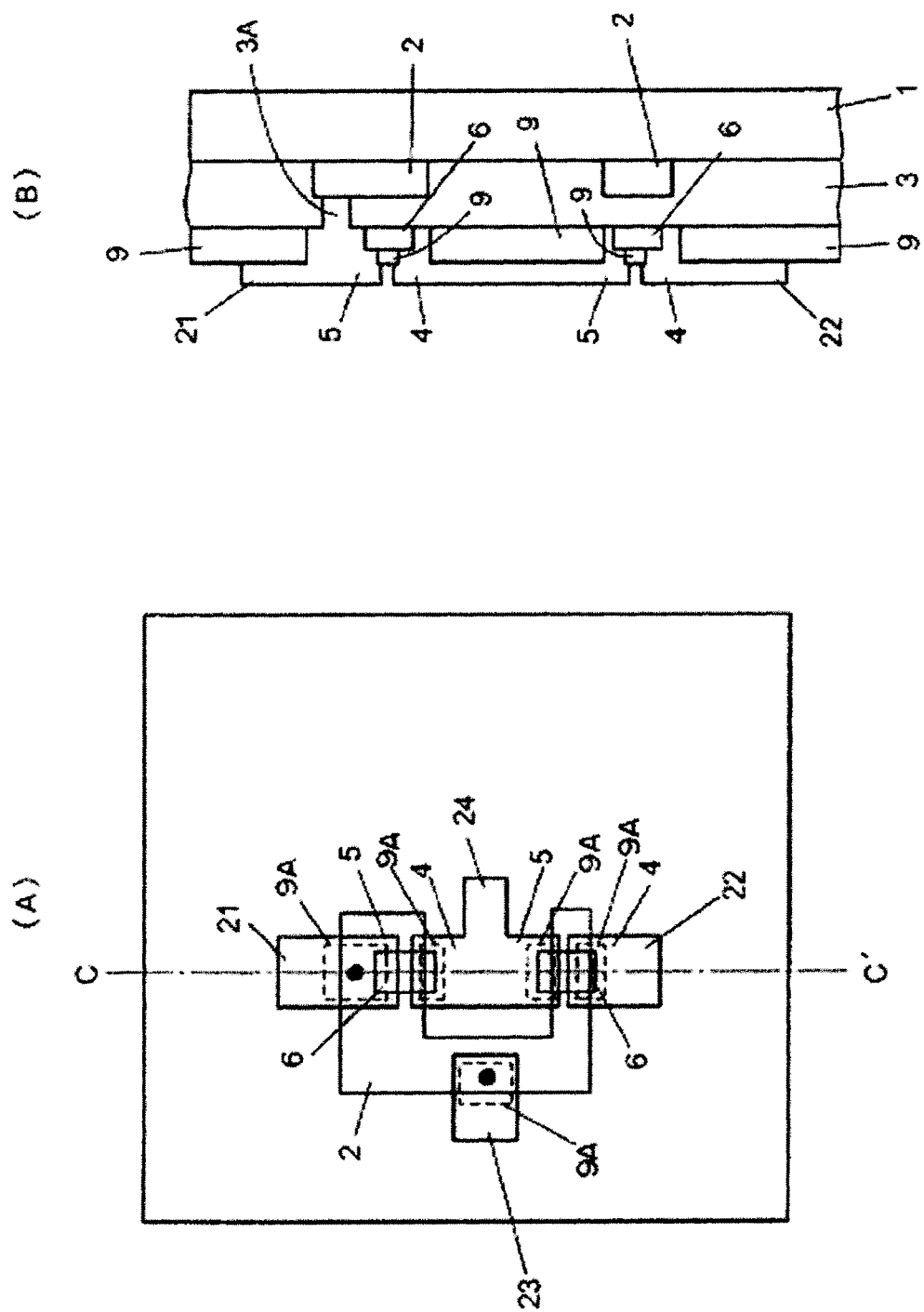
FIGS. 3 (A), (B) are a plan view and a cross-sectional view of another example in the first embodiment of a thin film transistor of the present invention.

Examples of a thin film transistor of the first embodiment of the present invention are shown in FIG. 1-3.

FIG. 1 shows a plan view of an inverter using thin film transistors of first example of this embodiment, and shows a cross-sectional view taken along the line A-A'.

In addition, FIG. 2 shows a plan view of an inverter using thin film transistors of second example of this embodiment, and shows a cross-sectional view taken along the line B-B'.

Further, FIG. 3 shows a plan view of an inverter using thin film transistors of third example of this embodiment, and shows a cross-sectional view taken along the line C-C'.

As shown in FIGS. 1-3, in thin film transistors of the first embodiment of the present invention, gate electrodes 2 are provided on an insulating substrate 1, a gate insulator 3 having an opening 3A and an oxide semiconductor pattern 6 are formed, further drain electrodes 5 and source electrodes 4 are provided. Further, a part of an upper face of semiconductor patterns 6 wherein the part is not covered by the source electrode 4 and the drain electrode 5 is covered by a sealing layer 9.

In FIG. 1, the sealing layer 9 is formed in an upper part of the source electrode 4/the drain electrode 5 so that the sealing layer 9 covers the semiconductor pattern 6. In FIG. 2, a sealing layer 9 is formed so as to cover channel parts of semiconductor patterns 6, thereafter parts which are not attached to the sealing layer 9 are connected to source electrodes 4/drain electrodes 5. In FIG. 3, a sealing layer covers not only channel parts of semiconductor patterns 6 but also all parts other than both a connected part with a source electrode 4/a drain electrode 5 and a connected part with a gate electrode. In addition, in the drawings, the reference numeral 9A is an opening of a sealing layer.

Figure 10:
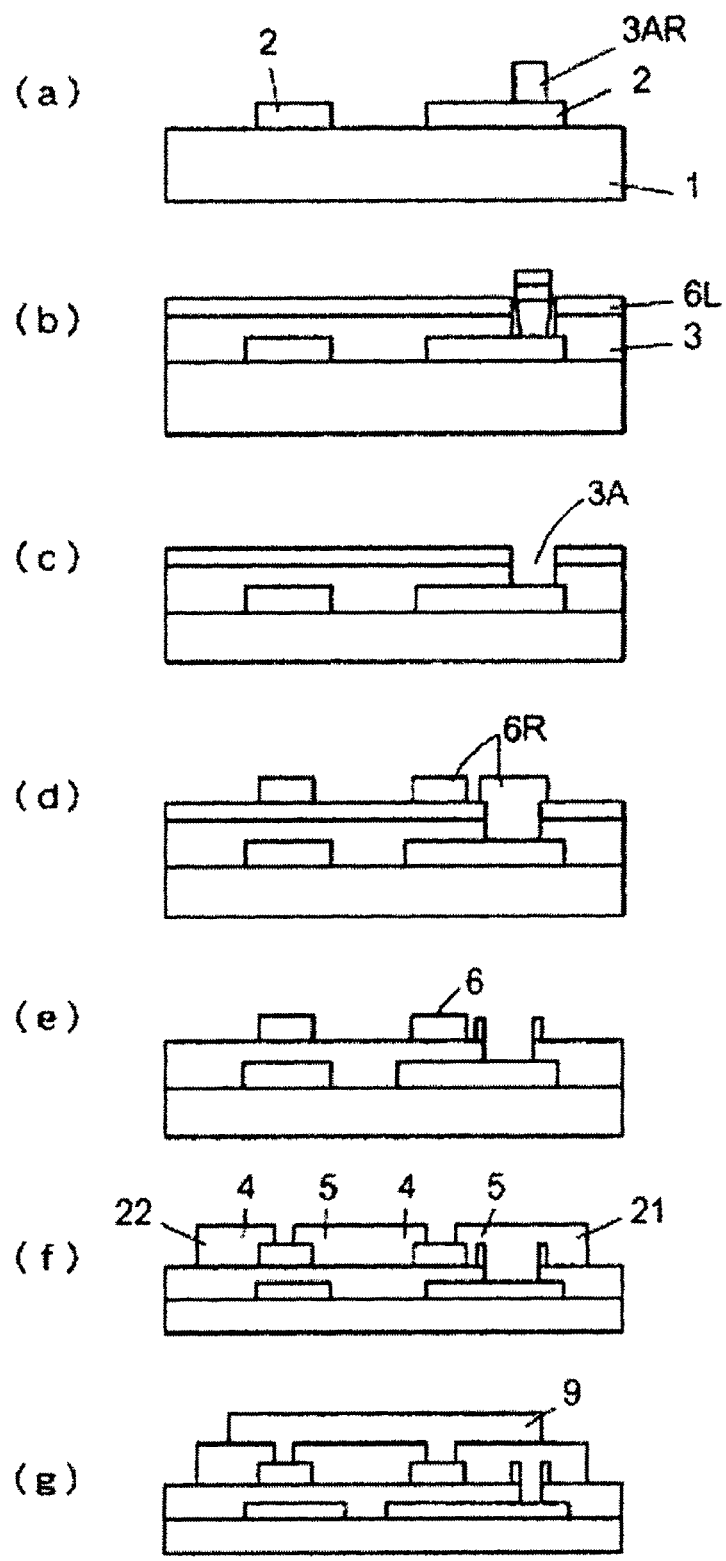
FIGS. 10 (*a*)-(*g*) are cross-sectional views of one example of processes of manufacturing a thin film transistor shown in FIG. 1.
Figure 11:
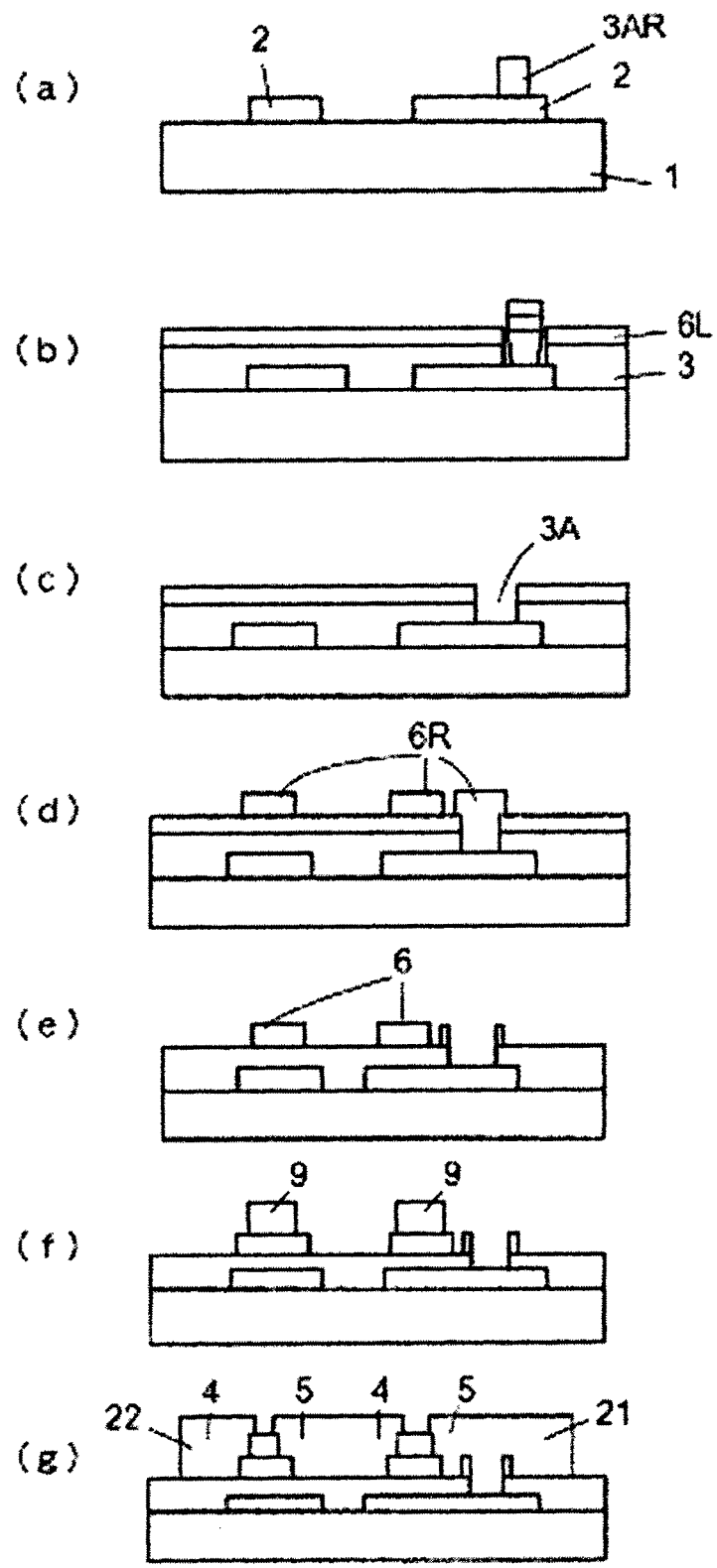
FIGS. 11 (*a*)-(*g*) are cross-sectional views of one example of processes of manufacturing a thin film transistor shown in FIG. 2.
Figure 12:
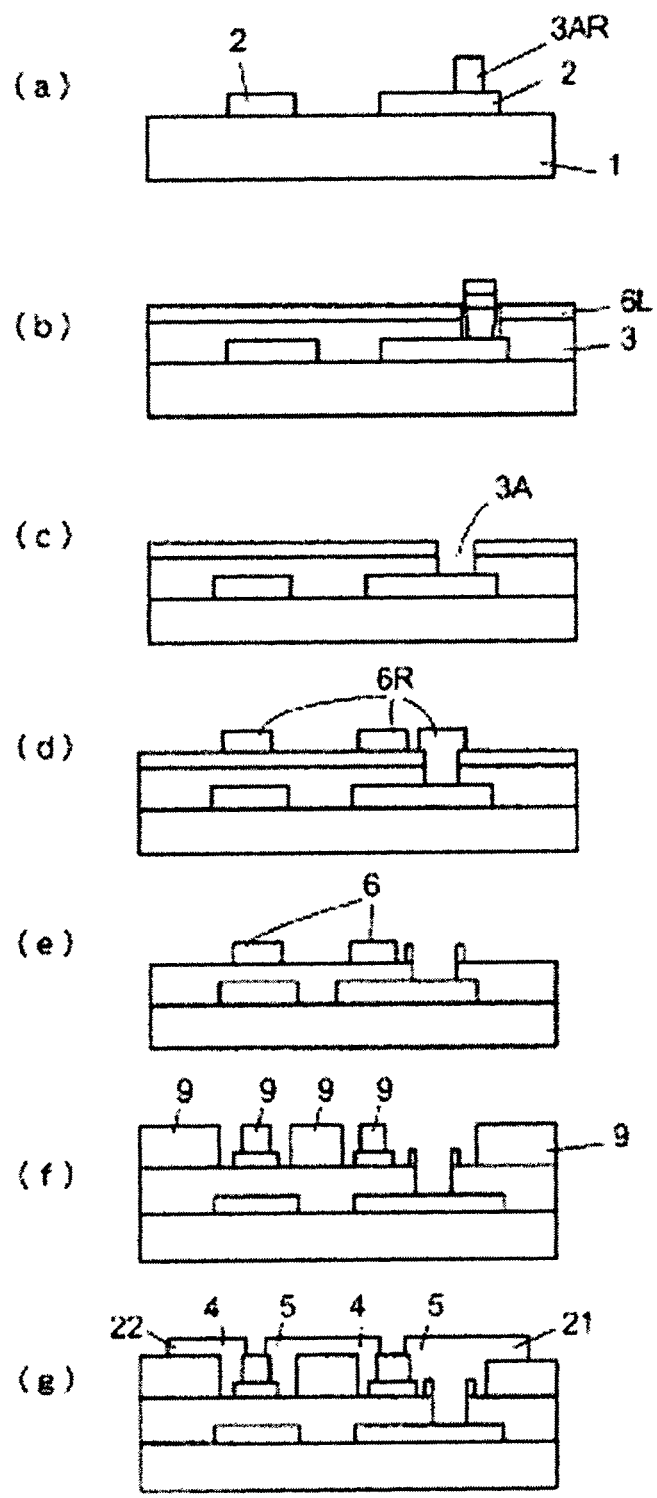
FIGS. 12 (*a*)-(*g*) are cross-sectional views of one example of processes of manufacturing a thin film transistor shown in FIG. 3.

Examples of the manufacturing method are shown in FIGS. 10-12. A rigid substrate such as a glass can be used for an insulating substrate 1. However, since the process temperature is low (200□ or less), a flexible plastic substrate can be used. Examples of the plastic include polyethylene terephthalate (PET), polyethylene naphthalate (PEN), polyethersulfone (PES), polyimide (PI), polyetherimide (PEI), polystyrene (PS), polyvinyl chloride (PVC), polyethylen (PE), polypropylene (PP), nylon (Ny).

Any conductive material can be used for a gate electrode 2. For example, metals such as Mo, Cr, Au, Ag, Cu, Ni, Al and Ti, or transparent conductive films such as ITO can be used. A photolithography and etching can be used for forming a pattern of the conductive film, however other methods such as a printing method can be used.

Inorganic insulating films such as SiON, SiOx, SiN, $Al_2O_3$ and $Y_2O_3$ can be used for a gate insulating film 3. A liftoff process is preferable as a method for forming an opening 3A. The liftoff process has a step of forming beforehand a resist pattern 3AR at a place to be an opening, a step of forming a gate insulator 3 and a step of removing an upper film with the resist pattern 3AR. However, other methods such as a usual photolithography with etching can also be used.

InGaZnO, InGaSnO, ZnGaO, GaSnO, InGaZnMgO or the like can be used for an oxide semiconductor pattern 6. A photolithography method with etching is desirable for a method for forming a pattern of the oxide semiconductor, however other methods such as a printing method can be used.

It is important for the resist to be formed over the opening 3A so that the gate electrode 2 inside the opening 3A of the gate insulator is not exposed to an etchant of the oxide semiconductor in a case of forming the pattern of the oxide semiconductor.

In particular, the following method can be used: A resist pattern 3AR is formed at a place to be an opening of a gate insulator (See FIG. 10 (a), FIG. 11 (a) and FIG. 12 (a).); the gate insulator 3 and an oxide semiconductor layer 6L is continuously formed (See FIG. 10 (b), FIG. 11(b) and FIG. 12 (b).); the opening 3A is formed by performing a liftoff of the resist 3AR (See FIG. 10 (c), FIG. 11 (c) and FIG. 12 (c).); another resist is applied to the entire surface; a resist pattern 6R is left at both a semiconductor pattern and the opening (See FIG. 10 (d), FIG. 11 (d) and FIG. 12 (d).); and the oxide semiconductor is etched (See FIG. 10 (e), FIG. 11 (e) and FIG. 12 (e).).

The following method can also be used: a resist pattern 3AR is formed at a place to be an opening of a gate insulator; the gate insulator 3 and an oxide semiconductor layer 6L is continuously formed; another resist is applied to the entire surface without a liftoff of the resist 3AR; a pattern 6R for processing the semiconductor is formed (the resist pattern 3AR is also left in the opening.); the oxide semiconductor is etched. (This method is not shown in the figures, however this method is same as the method shown in FIGS. 10-12 except that a lift off of the resist 3AR is performed at the same time of removing 6R.)

Mo, Cu, Al, Ti and ITO which have a low resistance to acid can be used for the gate electrode 2 where these methods are used.

Various conductive materials can be used for a drain electrode 5 and a source electrode 4. For example, metals such as Mo, Cr, Au, Ag, Cu, Ni, Al and Ti, and transparent conductive films such as ITO can be used. In this case, a photolithography with etching, a liftoff, a printing or the like can be used. In a case where drain electrodes 5 and source electrodes 4 are formed before a sealing layer 9 shown in FIG. 10, a liftoff or a printing is preferable in order to prevent semiconductor patterns 6 from being damaged. In a case where drain electrodes 5 and source electrodes 4 are formed after a sealing layer 9 shown in FIGS. 11 and 12, a photolithography with etching can be used since semiconductor patterns 6 are covered by a sealing layer 9 or drain electrodes 5/source electrodes 4.

Inorganic insulating materials such as SiON, SiOx, SiN, $Al_2O_3$ and $Y_2O_3$ can be used for a sealing layer 9. These inorganic insulating films can be obtained by a sputtering method. In particular, SiON is preferable, since a film having good insulating properties with little defect can be easily obtained by reactive sputtering. In a case where SiN sintered body is used as a target and a flow rate of oxygen is properly controlled (For example, a flow rate of oxygen/(a flow rate of oxygen and argon) is 5%-20%.), good sealing properties can be achieved. In a SiN obtained by usual sputtering using argon, the stress inside the film becomes too large, thereby the film is easily peeled off. In a case where a flow rate of oxygen is big, a rate of depositing becomes very slow.

In addition, a fluorinated polymer in which the hydrogen of a polymer is exchanged for fluorine can be used for a sealing layer 9. Examples of the fluorinated polymer include fluorinated epoxy, fluorinated acryl, fluorinated polyimide, polyvinylidene fluoride, fluorinated olefin/propylene copolymer, fluorinated olefin/vinyl ether copolymer, fluorinated olefin/vinyl ester copolymer and fluorinated ether cyclization polymerization body. Fluorinated polymers include a partially fluorinated polymer in which a part of hydrogen is exchanged for fluorine and a fully fluorinated polymer in which all the hydrogen is exchanged for fluorine, however a fully fluorinated polymer is preferable. A fluorinated polymer is a stable material and does not give a harmful effect to an oxide semiconductor in contrast to a general polymer (epoxy, acrylic or the like).

In a case of using an inorganic insulating film, patterning is preferably performed by a liftoff.

In a case of a fluorinated polymer, patterning can be performed by a printing method (a screen printing, a flexo printing, a reverse printing or an inkjet printing). Or, only a contact part can be peeled off using tweezers after a polymer is applied to the entire surface.

Channel widths are determined according to widths of semiconductor patterns 6. In a case where source electrodes 4 and drain electrodes 5 are formed before a sealing layer 9 (See FIG. 1 and FIG. 10.), channel lengths are determined according to distances between source electrodes 4 and drain electrodes 5. In a case where source electrodes 4 and drain electrodes 5 are formed after a sealing layer 9 (See FIGS. 2, 3, 11 and 12.), channel lengths are determined according to widths of a sealing layer 9. In a case where all parts except for connection parts are covered by a sealing layer 9 as shown in FIG. 3, there are advantages that a leakage current and a stray capacitance at an intersection part of wires can be reduced.

In addition, the thin film transistors shown in FIGS. 1-3 are inverters. However, other logic circuits such as NAND, NOR and shift register can be manufactured by the same method. In addition, the thin film transistors shown in FIGS. 1-3 are an enhancement/enhancement (E/E) type, but our invention is not limited to this. That is, thin film transistors can be an enhancement/depression type and a complementary type. However, since an oxide semiconductor is usually an n type, it is necessary for the oxide semiconductor to combine with a p type semiconductor in order to make a complementary type. In addition, such a logic circuit can be used not only for IC but also for a peripheral circuit of a display. That is, the logic circuit can be arranged in a surrounding area of a matrix array.

The Second Embodiment

Figure 4:
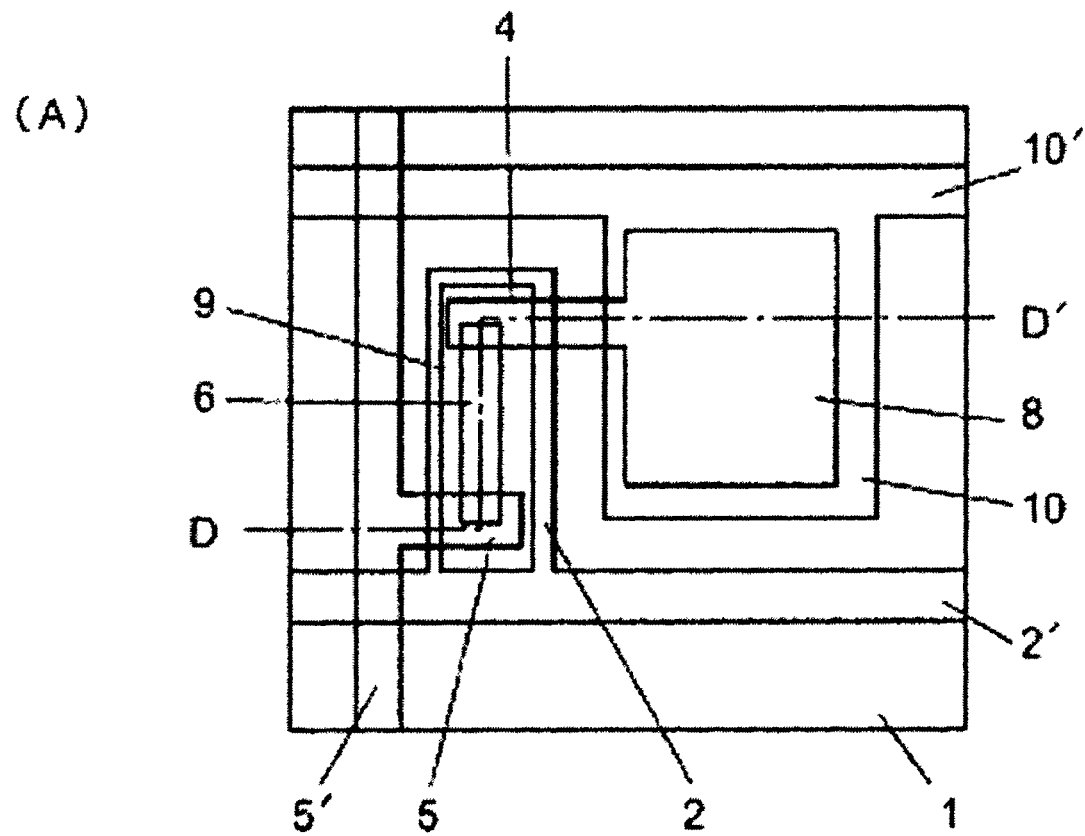
FIGS. 4 (A), (B) are a plan view and a cross-sectional view of one example in the second embodiment of a thin film transistor of the present invention.
Figure 4:
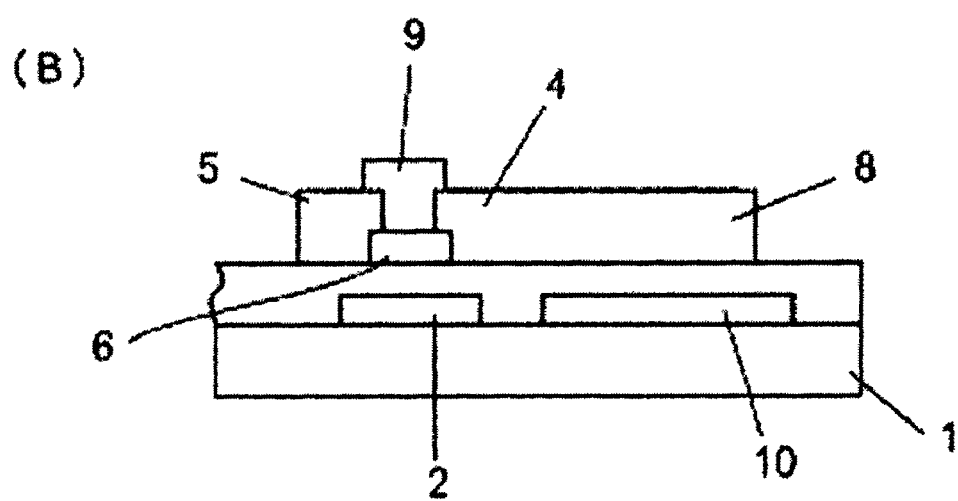
Figure 5:
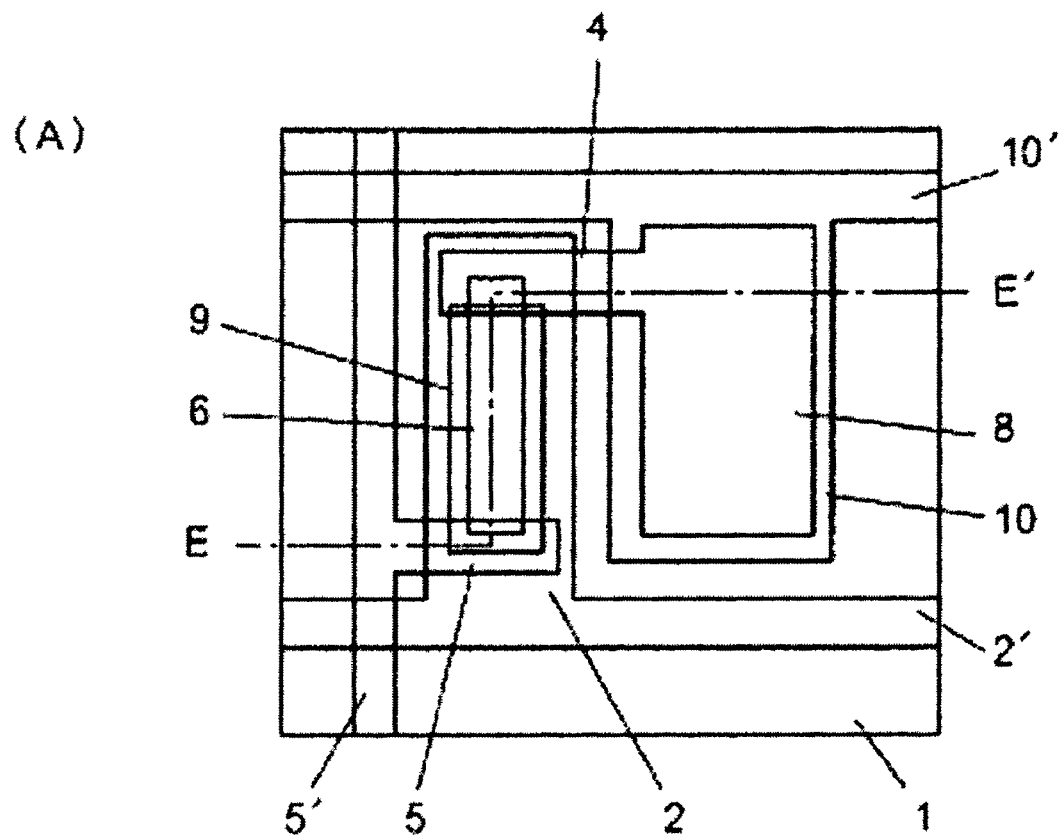
FIGS. 5 (A), (B) are a plan view and a cross-sectional view of another example in the second embodiment of a thin film transistor of the present invention.
Figure 5:
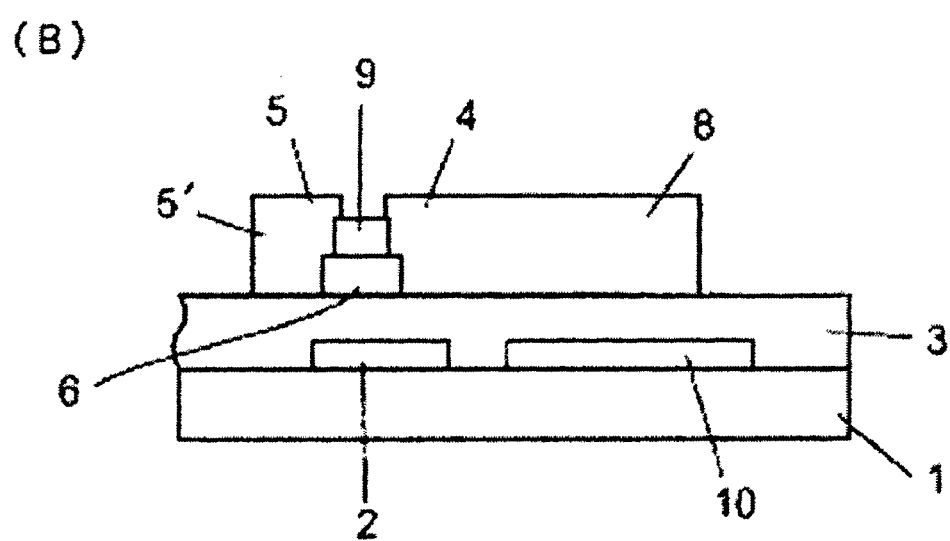
Figure 6:
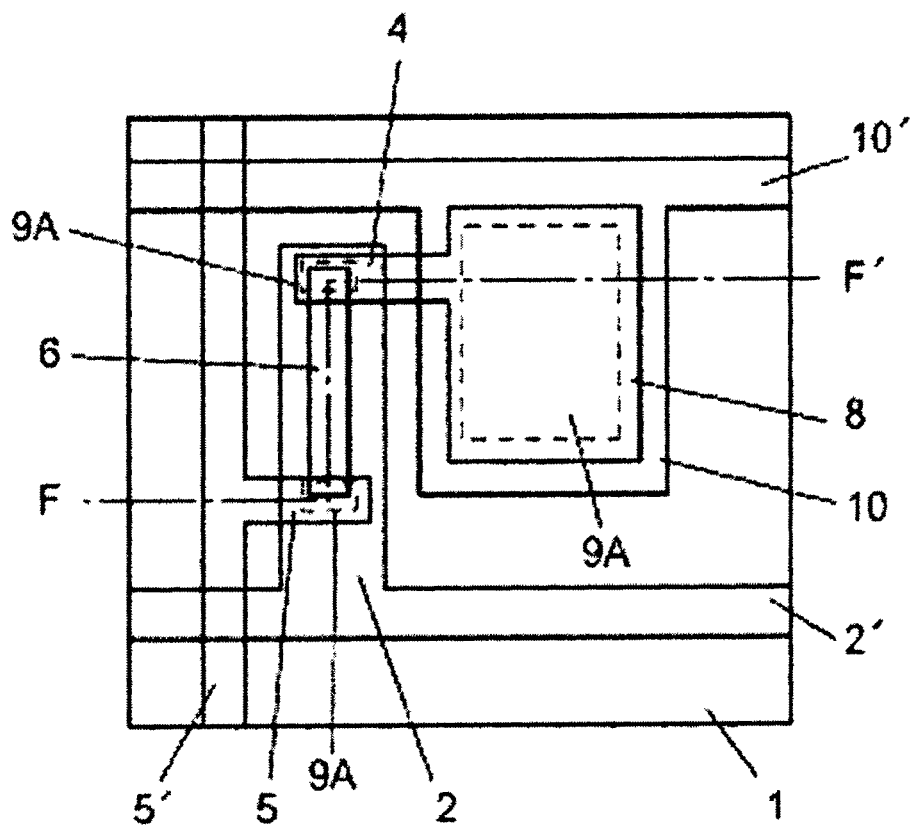
FIGS. 6 (A), (B) are a plan view and a cross-sectional view of another example in the second embodiment of a thin film transistor of the present invention.
Figure 6:
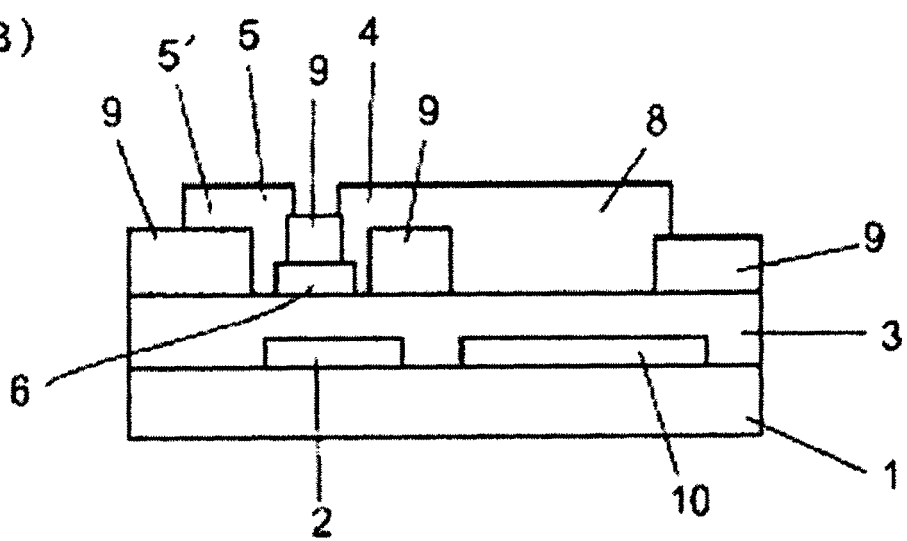

Examples of a thin film transistor of the second embodiment of the present invention are shown in FIG. 4-6.

FIG. 4 shows a plan view of one pixel inside a TFT array using a thin film transistor of first example of this embodiment, and shows a cross-sectional view taken along the line D-D'.

In addition, FIG. 5 shows a plan view of one pixel inside a TFT array using a thin film transistor of second example of this embodiment, and shows a cross-sectional view taken along the line E-E'.

Further, FIG. 6 shows a plan view of one pixel inside a TFT array using a thin film transistor of third example of this embodiment, and shows a cross-sectional view taken along the line F-F'.

As shown in FIGS. 4-6, a thin film transistor has a gate electrode 2 on an insulating substrate 1, a gate wire 2' connected to the gate electrode 2, a capacitor electrode 10, a capacitor wire 10' connected to the capacitor electrode 10, a gate insulator 3 and a oxide semiconductor pattern 6, a drain electrode 5, a drain wire 5' connected to the drain electrode 5, a source electrode 4, and a pixel electrode 8 connected to the source electrode 4.

A part of the oxide semiconductor pattern 6 which is not covered by the source electrode 5 and the drain electrode 5, is covered by a sealing layer 9. The pixel electrode 8 applies a voltage to a display showing an image. Therefore, it is desirable that the pixel electrode 8 is not covered by a sealing layer 9.

In FIG. 4, a sealing layer 9 is formed over the source electrode 4 and the drain electrode 5 so as to cover the semiconductor pattern 6. In addition, in FIG. 5, after a sealing layer 9 has been formed to cover a channel part of a semiconductor pattern 6, the part which does not touch the sealing layer 9 is connected to a source electrode 4 and a drain electrode 5. In addition, in FIG. 6, a sealing layer 9 covers not only a channel part of a semiconductor pattern 6 but also all parts except for a connecting part with a source electrode 4 and a drain electrode 5 and except for bottom of a pixel electrode 8 which is a part of a capacitor with capacitor electrode 10.

Figure 13:
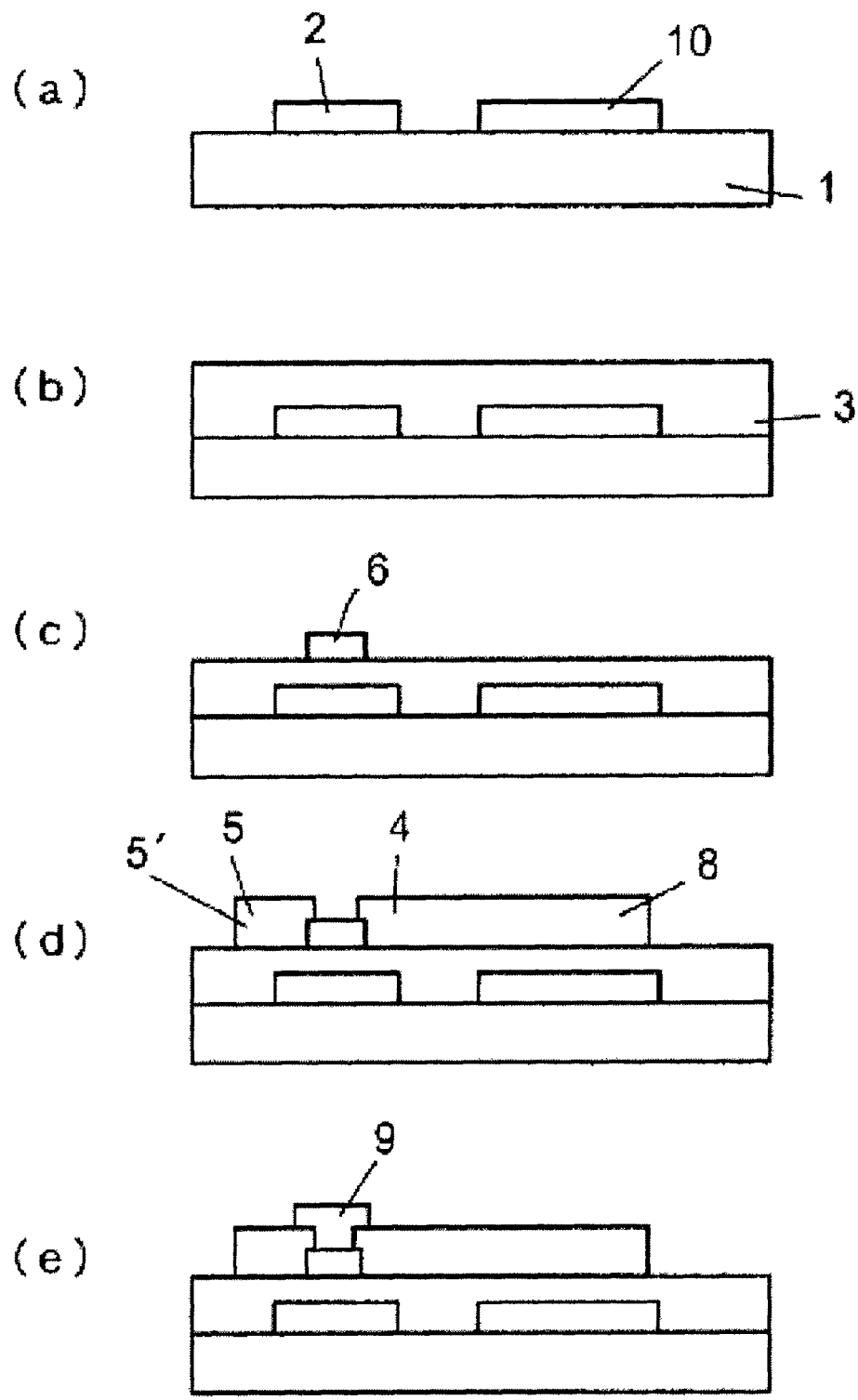
FIGS. 13 (*a*)-(*e*) are cross-sectional views of one example of processes of manufacturing a thin film transistor shown in FIG. 4.
Figure 14:
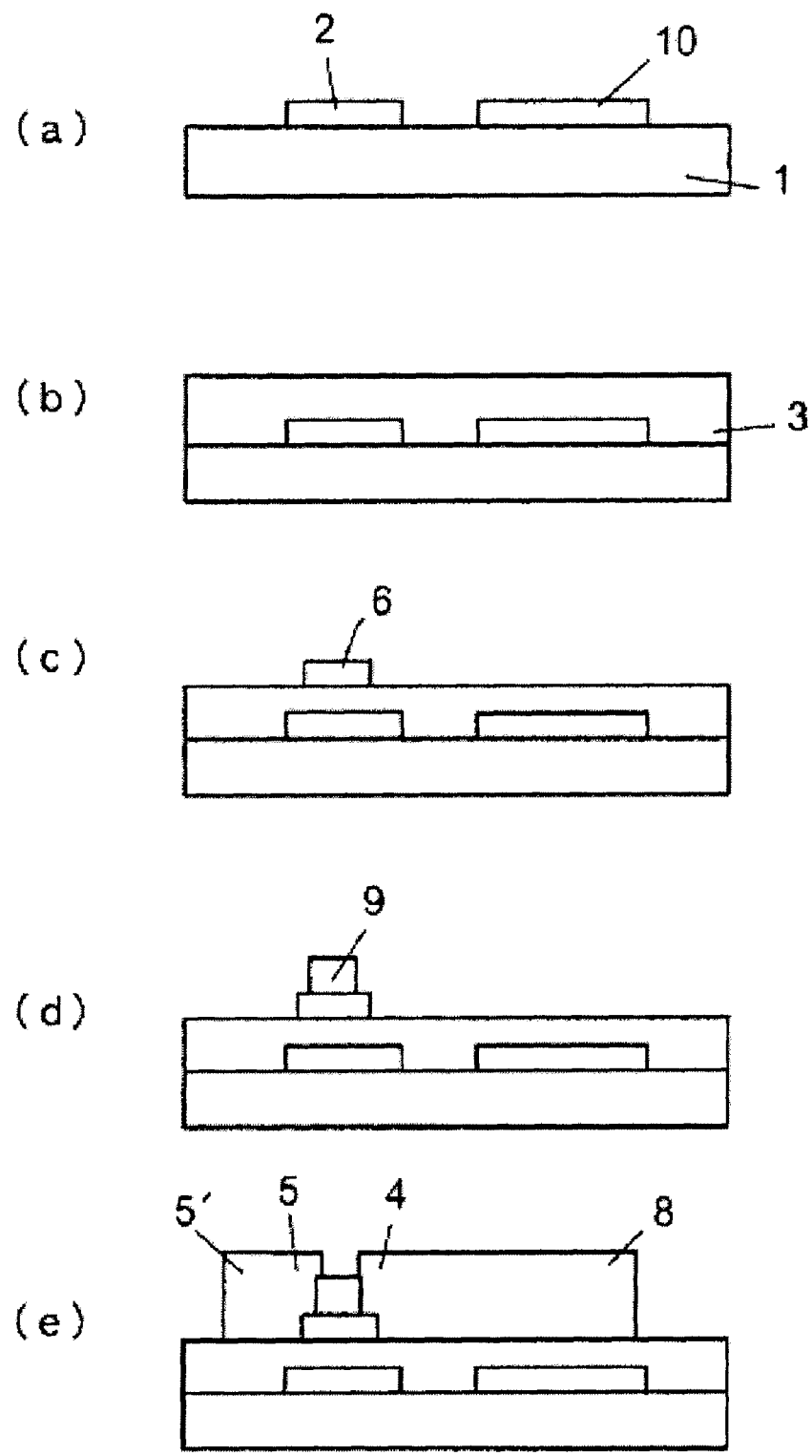
FIGS. 14 (*a*)-(*e*) are cross-sectional views of one example of processes of manufacturing a thin film transistor shown in FIG. 5.
Figure 15:
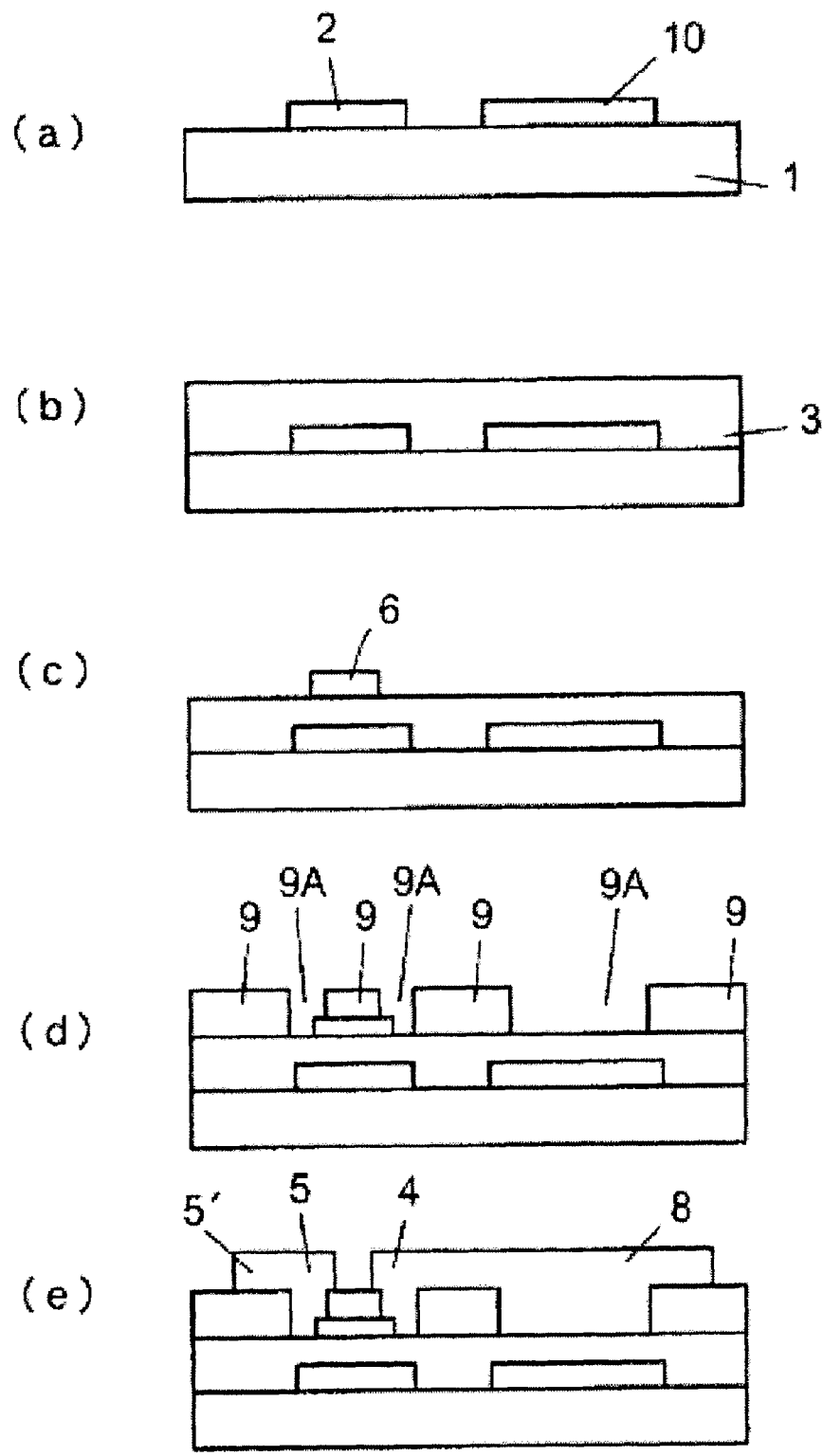
FIGS. 15 (*a*)-(*e*) are cross-sectional views of one example of processes of manufacturing a thin film transistor shown in FIG. 6.

Examples of the manufacturing method are shown in FIGS. 13-15. A rigid substrate such as a glass can be used for an insulating substrate 1. However, since the process temperature is low (200□ or less), a flexible plastic substrate can be used. Examples of the plastic include polyethylene terephthalate (PET), polyethylenenaphthalate (PEN), polyethersulfone (PES), polyimide (PI), polyetherimide (PEI), polystyrene (PS), polyvinyl chloride (PVC), polyethylen (PE), polypropylene (PP), nylon (Ny).

Any conductive film can be used for a gate electrode 2, a gate wire 2', a capacitor electrode 10 and a capacitor wire 10'. For example, metals such as Mo, Cr, Au, Ag, Cu, Ni, Al and Ti, and transparent conductive films such as ITO can be used. A photolithography and etching can be used for forming a pattern of the conductive film, however other methods such as a printing method can be used.

Inorganic insulating films such as SiON, SiOx, SiN, $Al_2O_3$ and $Y_2O_3$ can be used for a gate insulating film 3.

InGaZnO, InGaSnO, ZnGaO, GaSnO or the like can be used for an oxide semiconductor pattern 6. A photolithography method with etching is desirable for a method for forming a pattern of the oxide semiconductor, however other methods such as a printing method can be used.

Various conductive materials can be used for a drain electrode 5, a drain wire 5', a source electrode 4 and a pixel electrode 8. For example, metals such as Mo, Cr, Au, Ag, Cu, Ni, Al and Ti, or transparent conductive films such as ITO can be used. In this case, a photolithography with etching, a liftoff, a printing method or the like can be used. In a case where a drain electrode 5 and a source electrode 4 are formed before a sealing layer 9 shown in FIG. 13, a liftoff or a printing method is preferable in order to prevent a semiconductor pattern 6 from being damaged. In a case where a drain electrode 5 and a source electrode 4 are formed after a sealing layer 9 shown in FIGS. 14 and 15, a photolithography with etching can be used since a semiconductor pattern 6 is covered by a sealing layer 9 or a drain electrode 5/a source electrode 4.

Inorganic insulating materials such as SiON, SiOx, SiN, $Al_2O_3$ and $Y_2O_3$ can be used for a sealing layer 9. These inorganic insulating films can be obtained by a sputtering method. In particular, SiON is preferable, since a film having good insulating properties with little defect can be easily obtained by reactive sputtering. In a case where a SiN sintered body is used as a target and a flow rate of oxygen is properly controlled (For example, a flow rate of oxygen/a flow rate of oxygen and argon is 5%-20%.), good sealing properties can be achieved. In a case of SiN obtained by usual sputtering using argon, the stress inside the film is too large, thereby the film is easily peeled off. In a case where a flow rate of oxygen is large, a rate of depositing becomes very slow.

In addition, a fluorinated polymer in which the hydrogen of a polymer is exchanged for fluorine can be used for a sealing layer 9. Examples of the fluorinated polymer include fluorinated epoxy, fluorinated acryl, fluorinated polyimide, polyvinylidene fluoride, fluorinated olefin/propylene copolymer, fluorinated olefin/vinyl ether copolymer, fluorinated olefin/vinyl ester copolymer and fluorinated ether cyclization polymerization body. Fluorinated polymers include a partially fluorinated polymer in which a part of hydrogen is exchanged for fluorine and a fully fluorinated polymer in which all hydrogen is exchanged for fluorine, however a fully fluorinated polymer is preferable. A fluorinated polymer is a stable material and does not give a harmful effect to an oxide semiconductor in contrast to a general polymer (epoxy, acrylic or the like).

In a case of an inorganic insulating film, patterning is preferably performed by a liftoff.

In a case of a fluorinated polymer, patterning can be performed by a printing method (a screen printing, a flexo printing, an inverted printing or an inkjet printing).

A channel width is determined according to a width of a semiconductor pattern 6. In a case where a source electrode 4 and a drain electrode 5 are formed before a sealing layer 9 (See FIG. 4 and FIG. 13.), a channel length is determined according to a distance between a source electrode 4 and a drain electrode 5. In a case where a source electrode 4 and a drain electrode 5 are formed after a sealing layer 9 (See FIGS. 5, 6, 14 and 15.), a channel length is determined according to a width of a sealing layer 9. In a case where all parts except for connection parts are covered by a sealing layer 9 as shown in FIG. 6, there are advantages in that a leakage current and a stray capacitance at an intersection part of wires can be reduced.

The Third Embodiment

Figure 7:
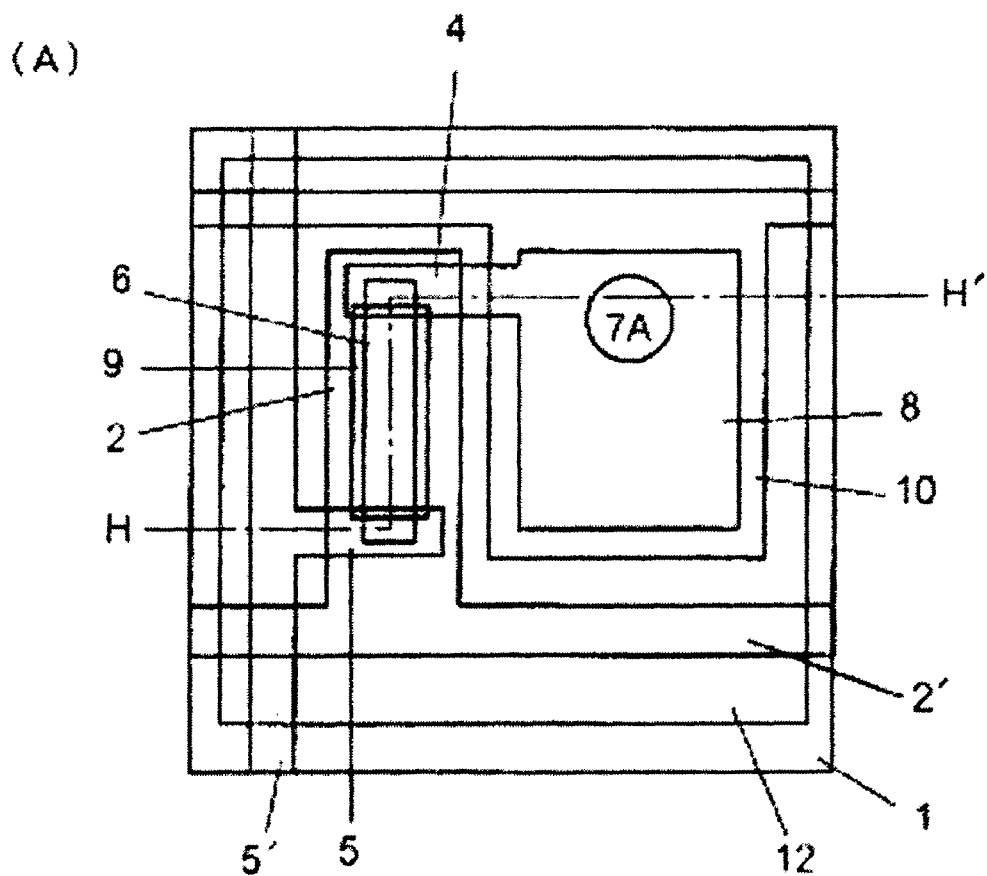
FIGS. 7 (A), (B) are a plan view and a cross-sectional view of one example in the third embodiment of a thin film transistor of the present invention.
Figure 7:
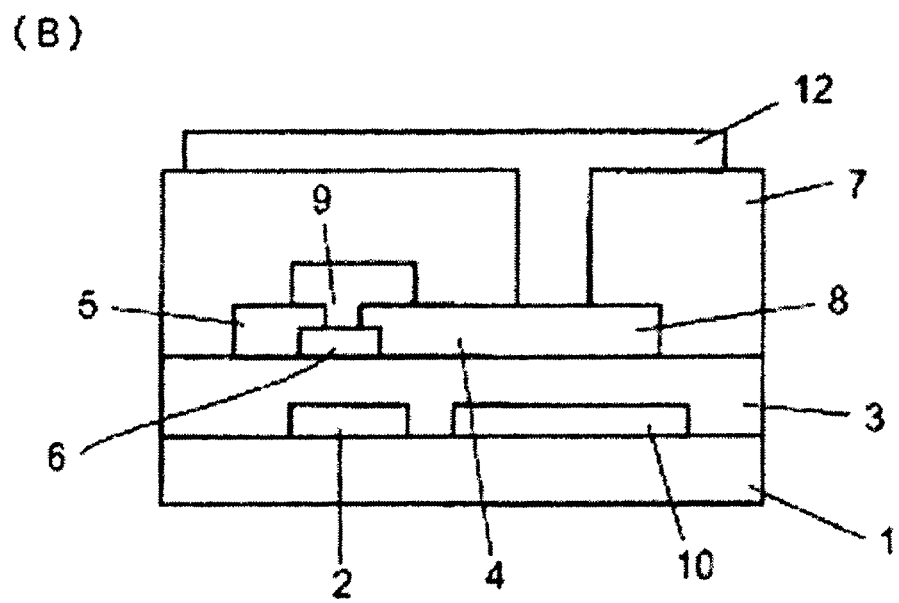
Figure 8:
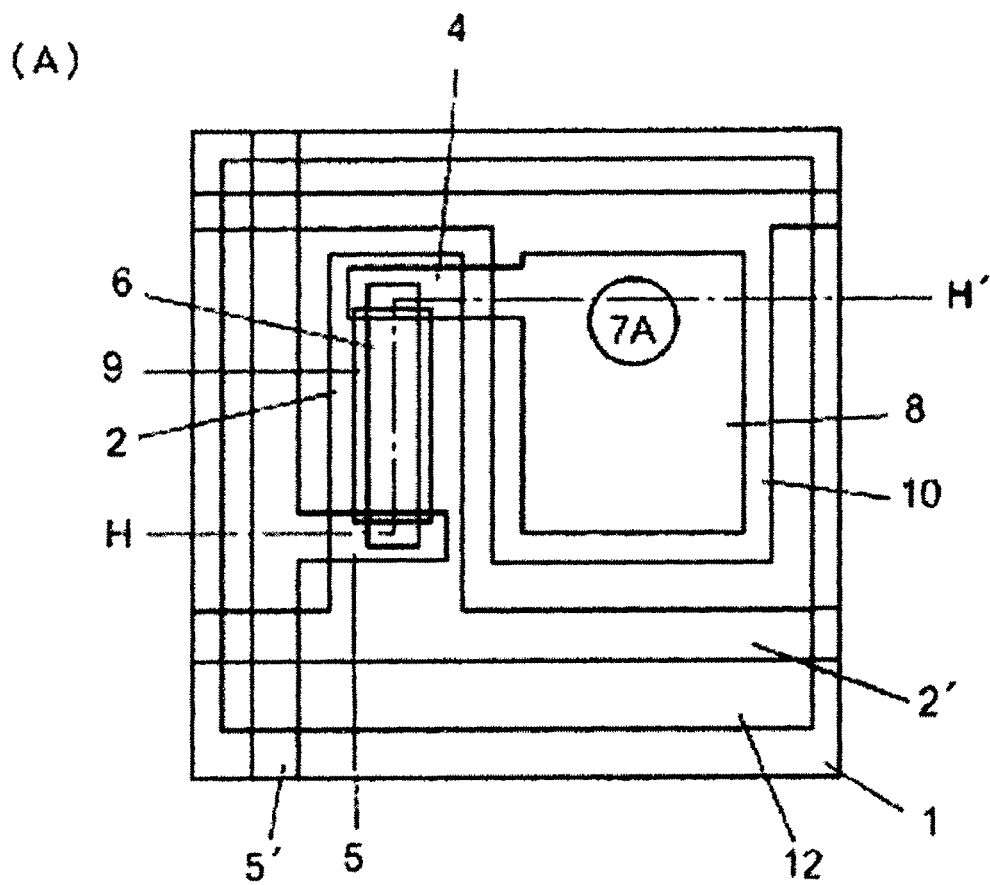
FIGS. 8 (A), (B) are a plan view and a cross-sectional view of another example in the third embodiment of a thin film transistor of the present invention.
Figure 8:
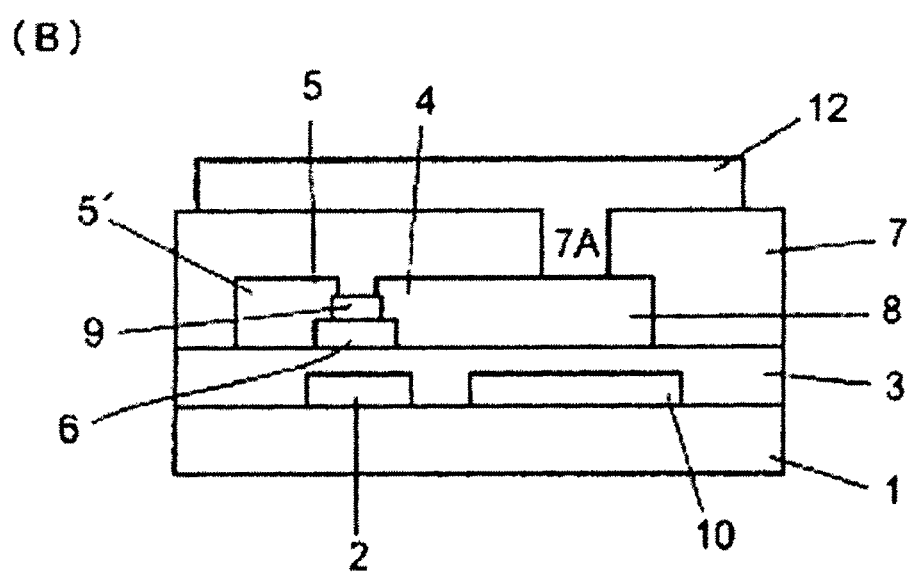
Figure 9:
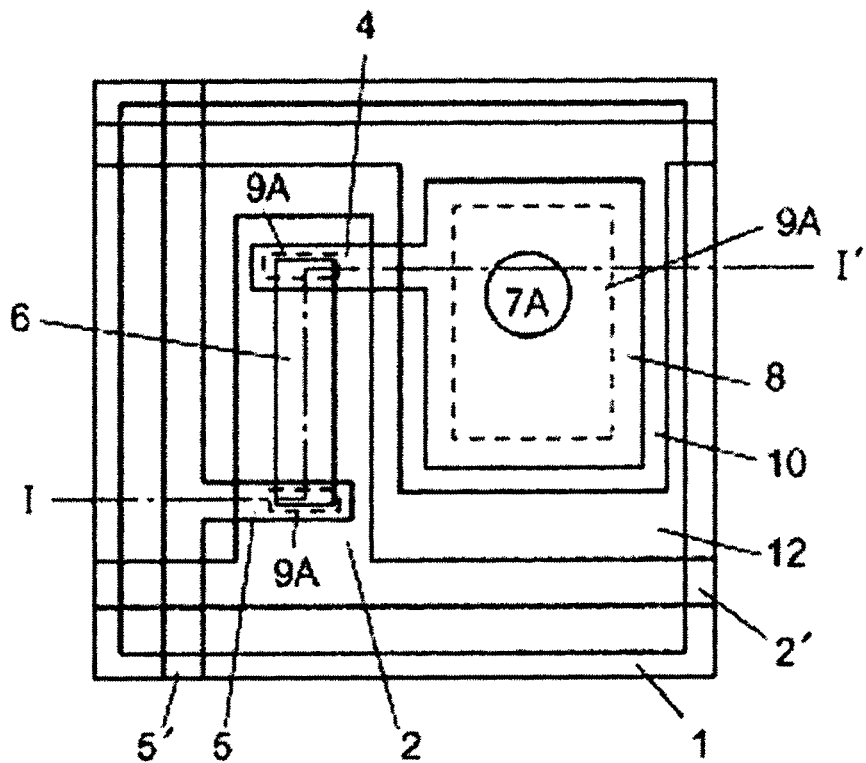
FIGS. 9 (A), (B) are a plan view and a cross-sectional view of another example in the third embodiment of a thin film transistor of the present invention.
Figure 9:
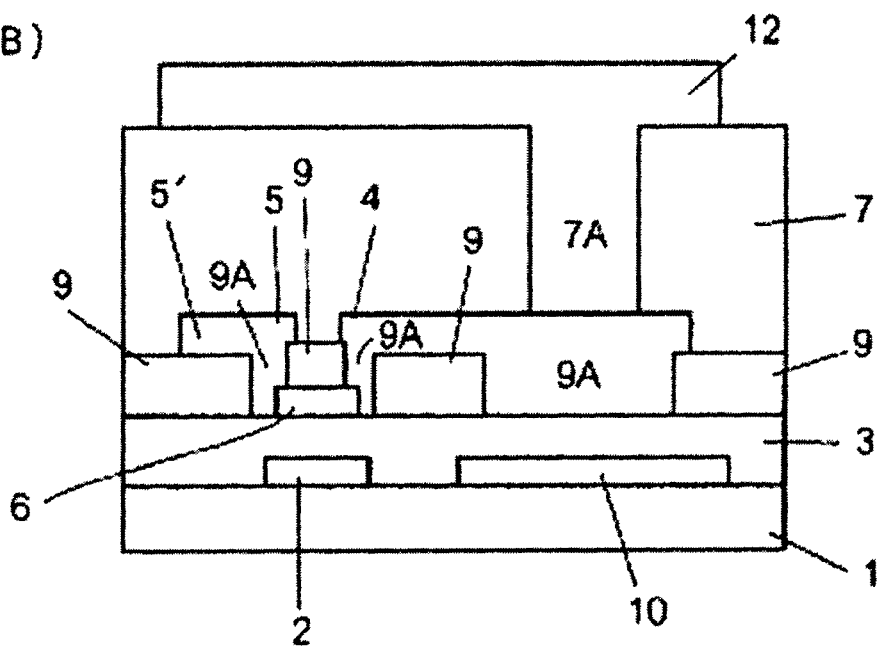

Examples of a thin film transistor of the third embodiment of the present invention are shown in FIG. 7-9.

FIG. 7 shows a plan view of one pixel inside a TFT array using a thin film transistor of a first example of this embodiment, and shows a cross-sectional view taken along the line G-G'.

In addition, FIG. 8 shows a plan view of one pixel inside a TFT array using a thin film transistor of a second example of this embodiment, and shows a cross-sectional view taken along the line H-H'.

Further, FIG. 9 shows a plan view of one pixel inside a TFT array using a thin film transistor of a third example of this embodiment, and shows a cross-sectional view taken along the line I-I'.

As shown in FIGS. 7-9, a thin film transistor has a gate electrode 2 on an insulating substrate 1, a gate wire 2' connected to the gate electrode 2, a capacitor electrode 10, a capacitor wire 10' connected to the capacitor electrode 10, a gate insulator 3 and an oxide semiconductor pattern 6, a drain electrode 5, a drain wire 5' connected to the drain electrode 5, a source electrode 4, and a pixel electrode 8 connected to the source electrode 4. The upper part of the oxide semiconductor pattern 6 is covered by a sealing layer 9. Further, an interlayer dielectric 7 having an opening on the pixel electrode 8 is formed, and an upper pixel electrode 12 is formed on the interlayer dielectric 7. The upper pixel electrode 12 is connected to the pixel electrode 8 through the opening 7A of the interlayer dielectric. In addition, it is desirable that the upper pixel electrode 12 covers almost all parts of the drain electrode 5, the source electrode 4, the gate wire 2' and the capacitor electrode 10.

As shown in FIG. 7, a sealing layer 9 is formed on the source electrode 4 and the drain electrode 5 so as to cover the semiconductor pattern 6. In addition, in FIG. 8, after a sealing layer 9 has been formed so as to cover a channel part of a semiconductor layer 6, parts are connected to a source electrode 4 and a drain electrode 5 wherein the parts do not come into contact with the sealing layer 9. In addition, in FIG. 9, a sealing layer 9 covers not only a channel part of a semiconductor layer 6 but also all parts except for connecting parts with a source electrode 4 and a drain electrode 5 and except for bottom of a pixel electrode 8 which is a part of a capacitor with capacitor electrode 10.

Figure 16:
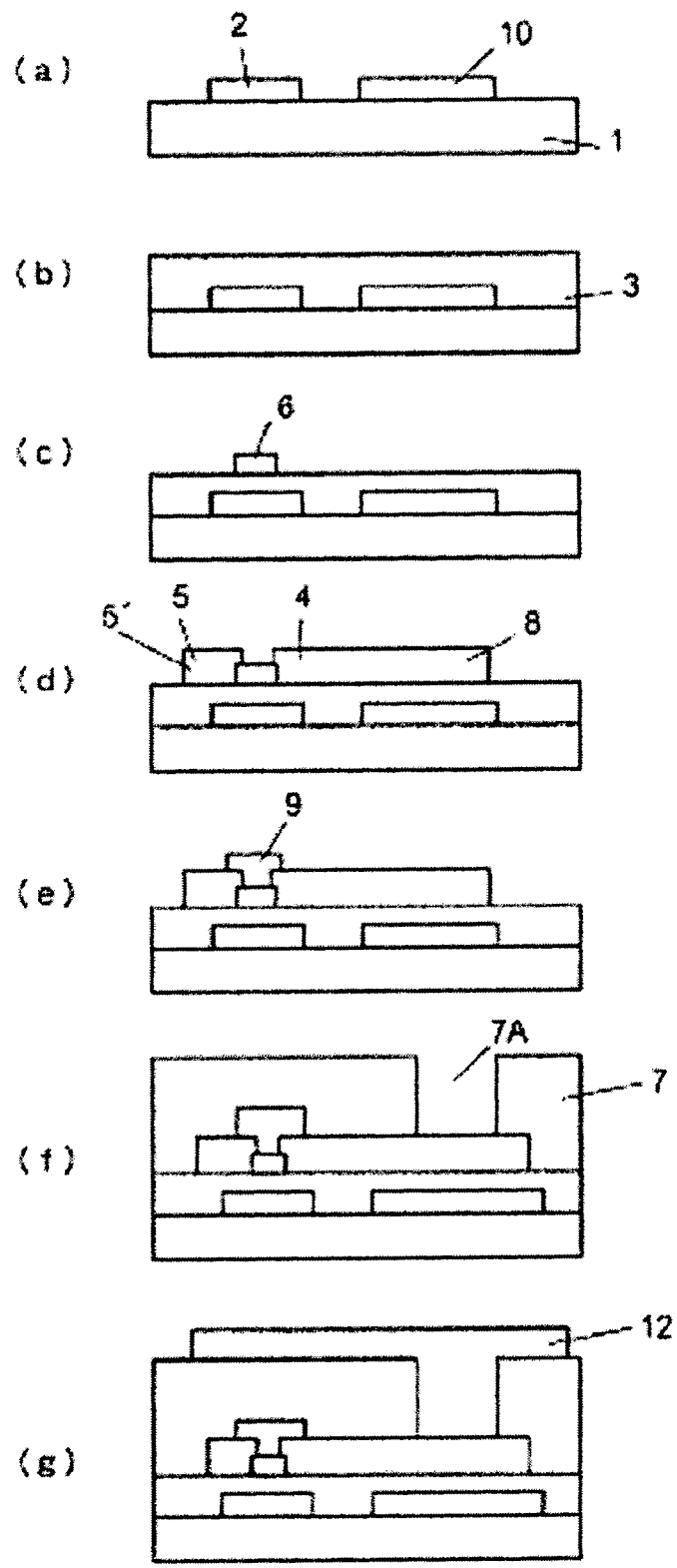
FIGS. 16 (*a*)-(*g*) are cross-sectional views of one example of processes of manufacturing a thin film transistor shown in FIG. 7.
Figure 17:
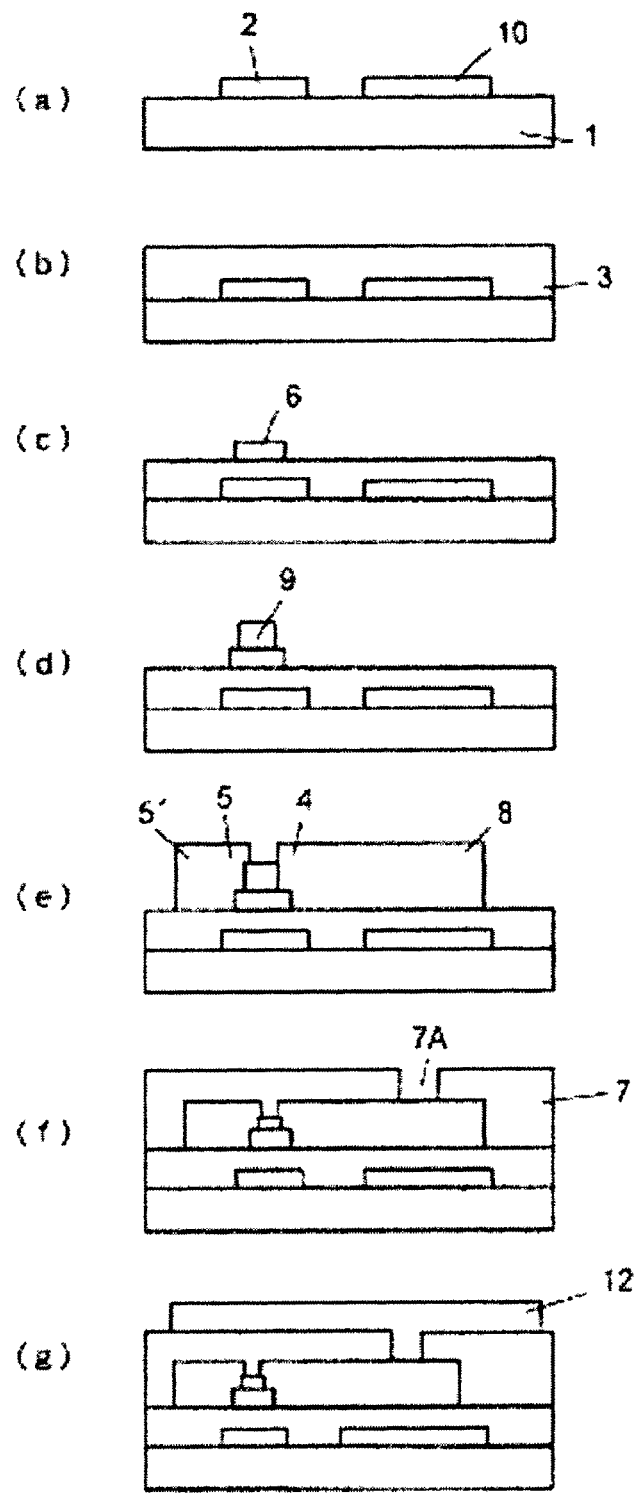
FIGS. 17 (a)-(g) are cross-sectional views of one example of processes of manufacturing a thin film transistor shown in FIG. 8.
Figure 18:
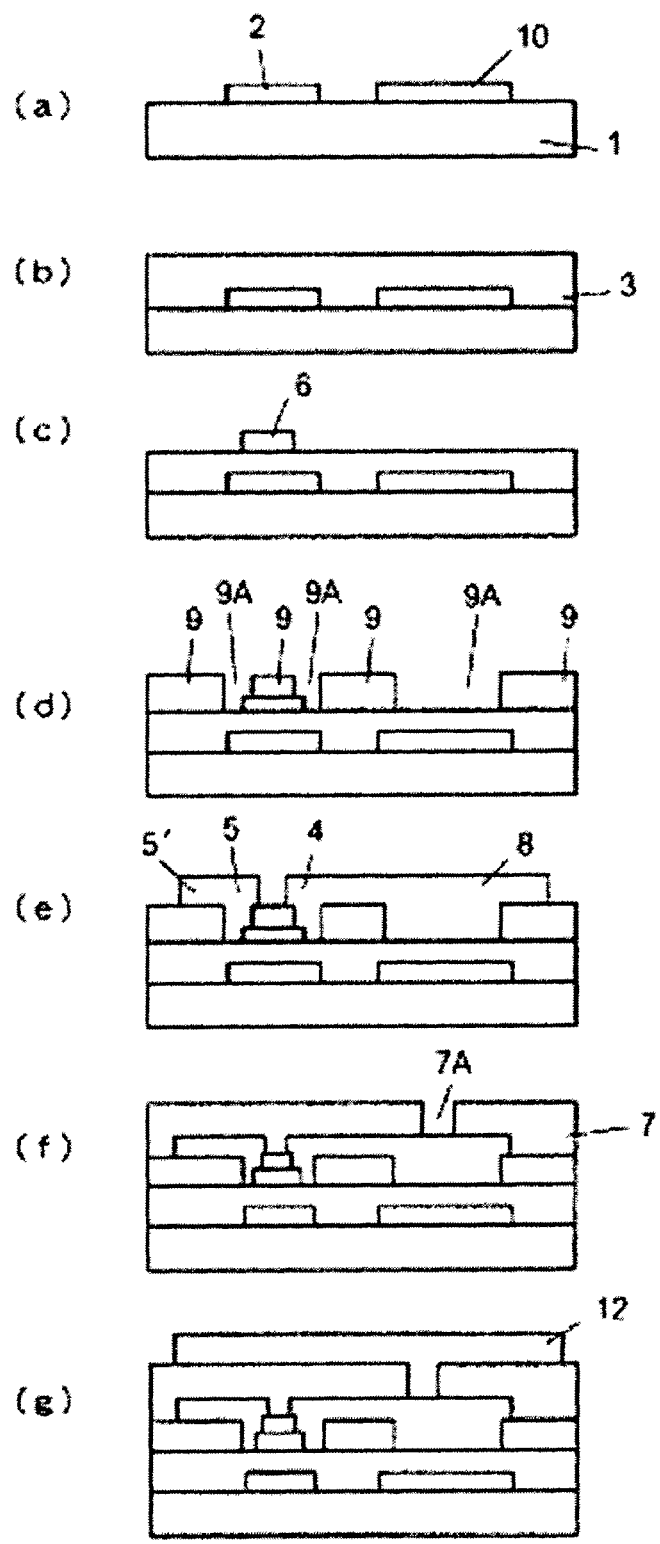
FIGS. 18 (a)-(g) are cross-sectional views of one example of processes of manufacturing a thin film transistor shown in FIG. 9.

Examples of the manufacturing method are shown in FIGS. 16-18. A rigid substrate such as a glass can be used for an insulating substrate 1. However, since the process temperature is low (200□ or less), a flexible plastic substrate can be used. Examples of the plastic include polyethylene terephthalate (PET), polyethylene naphthalate (PEN), polyethersulfone (PES), polyimide (PI), polyetherimide (PEI), polystyrene (PS), polyvinyl chloride (PVC), polyethylen (PE), polypropylene (PP), nylon (Ny).

Any conductive material can be used for a gate electrode 2, a gate wire 2', a capacitor electrode 10 and a capacitor wire 10'. For example, metals such as Mo, Cr, Au, Ag, Cu, Ni, Al and Ti, or transparent conductive films such as ITO can be used. A photolithography and etching can be used for forming a pattern of the conductive film, however other methods such as a printing method can be used.

Inorganic insulating films such as SiON, SiOx, SiN, $Al_2O_3$ and $Y_2O_3$ can be used for a gate insulating film 3.

InGaZnO, InGaSnO, ZnGaO, GaSnO or the like can be used for an oxide semiconductor pattern 6. A photolithography method with etching is desirable for a method for forming a pattern of the oxide semiconductor, however other methods such as a printing method can be used.

Various conductive materials can be used for a drain electrode 5, a drain wire 5', a source electrode 4 and a pixel electrode 8. For example, metals such as Mo, Cr, Au, Ag, Cu, Ni, Al and Ti, and transparent conductive films such as ITO can be used. In this case, a photolithography with etching, a liftoff, a printing method or the like can be used. In a case where a drain electrode 5 and a source electrode 4 are formed before a sealing layer 9 shown in FIG. 16, a liftoff or a printing method is preferable in order to prevent a semiconductor pattern 6 from being damaged. In a case where a drain electrode 5 and a source electrode 4 are formed after a sealing layer 9 shown in FIGS. 17 and 18, a photolithography with etching can be used since a semiconductor layer 6 is covered by a sealing layer 9 or a drain electrode 5/a source electrode 4.

Inorganic insulating materials such as SiON, SiOx, SiN, $Al_2O_3$ and $Y_2O_3$ can be used for a sealing layer 9. These inorganic insulating films can be obtained by a sputtering method. In particular, SiON is preferable, since a film having good insulating properties with little defect can be easily obtained by reactive sputtering. In a case where a SiN sintered body is used as a target and a flow rate of oxygen is properly controlled (For example, a flow rate of oxygen/a flow rate of oxygen and argon is 5%-20%.), good sealing properties can be achieved. In a case of SiN obtained by usual sputtering using argon, the stress inside the film is too large, thereby the film is easily peeled off. In a case where a flow rate of oxygen is large, a rate of depositing becomes very slow.

In addition, a fluorinated polymer in which the hydrogen of a polymer is exchanged for fluorine can be used for a sealing layer 9. Examples of the fluorinated polymer include fluorinated epoxy, fluorinated acryl, fluorinated polyimide, polyvinylidene fluoride, fluorinated olefin/propylene copolymer, fluorinated olefin/vinyl ether copolymer, fluorinated olefin/vinyl ester copolymer and fluorinated ether cyclization polymerization body. Fluorinated polymers include a partially fluorinated polymer in which a part of hydrogen is exchanged for fluorine and a fully fluorinated polymer in which all hydrogen is exchanged for fluorine, however a fully fluorinated polymer is preferable. A fluorinated polymer is a stable material and does not give a harmful effect to an oxide semiconductor in contrast to a general polymer (epoxy, acrylic or the like).

In a case of an inorganic insulating film, patterning is preferably performed by a liftoff. In a case of a fluorinated polymer, patterning can be performed by a printing method (a screen printing, a flexo printing, a reverse printing or an inkjet printing).

A channel width is determined according to a width of a semiconductor pattern 6. In a case where a source electrode 4 and a drain electrode 5 are formed before a sealing layer 9 (See FIG. 7 and FIG. 16.), a channel length is determined according to a distance between a source electrode 4 and a drain electrode 5. In a case where a source electrode 4 and a drain electrode 5 are formed after a sealing layer 9 (See FIGS. 8, 9, 17 and 18.), a channel length is determined according to a width of a sealing layer 9. In a case where all parts except for connection parts are covered by a sealing layer 9 as shown in FIG. 9, there are advantages in that a leakage current and a stray capacitance at an intersection part of wires can be reduced.

Organic insulating materials such as epoxy or acrylic are preferably used for an interlayer dielectric 7. The following methods are preferable: an interlayer dielectric having an opening is directly formed by a screen printing method; or a photosensitive material is formed on the entire surface, thereafter an opening is formed by exposure and development.

Any conductive materials can be used for an upper pixel electrode 12. For example, metals such as Mo, Cr, Au, Ag, Cu, Ni, Al and Ti, or transparent conductive films such as ITO can be used. This upper pixel electrode 12 applies a voltage to a display showing an image. The method for manufacturing the upper pixel electrode 12 is described below. After a film has been formed on the entire surface, photolithography and etching may be performed. However, a printing method (especially a screen printing method) is preferable, since a film formation and a patterning can be simultaneously performed by a simple process.

Incidentally, in an oxide semiconductor, an oxygen vacancy acts an n type carrier. Therefore, many oxide semiconductors act as n type. In a case where a general non-fluorinated polymer is applied on an oxide semiconductor, the non-fluorinated polymer is oxidized, and the oxide semiconductor is reduced, thereby the number of oxygen vacancies (a carrier) inside the oxide semiconductor is increased. In the case of ITO used as a transparent electrode or a P-N junction element, semiconductors are inherently used in a state where many carriers exist. Therefore, in ITO or a P-N junction element, even if the number of carriers is slightly increased, there are not any problems. However, in the case of thin film transistors where carriers are few in a basic state, the increase of carriers due to an outside factor causes a shift in threshold. This causes a large problem.

An inorganic insulating film or a fluorinated polymer manufactured in a good condition has a small function of taking oxygen. Therefore, if the inorganic insulating film or the fluorinated polymer is formed on an oxide semiconductor, it does not increase the carriers. Even if a usual polymer is applied on the inorganic insulating film or the fluorinated polymer, the inorganic insulating film or the fluorinated polymer blocks a function of taking oxygen. Therefore, carriers are not increased.

In addition, since TFT is used for a display, TFT shown in FIGS. 4-9 is used as a matrix type array. In addition, as TFT shown in FIGS. 4-9 is used for switching, role of source and drain are equivalent. Therefore, names of source and drain are only for convenience, and a drain electrode 5 can be called as a source electrode and a source electrode 4 can be called as a drain electrode.

In a thin film transistor of the present invention, a sealing layer is formed on an oxide semiconductor. Therefore, even if a usual non-fluorinated polymer is applied to the sealing layer, the change of the characteristics of TFT can be decreased. Therefore, in a display using such a thin film transistor, a high quality image display can be realized because of the stabilized TFT characteristics.

In addition, in a method for manufacturing a thin film transistor of the present invention, when an oxide semiconductor is etched, a resist is left over an opening of a gate insulator. Therefore, unintentional etching of a gate electrode can be prevented. In addition, a sealing layer is formed by a reactive sputtering, thereby a sealing layer having a good performance can be obtained. Further, the upper pixel electrode is formed by a screen printing, thereby manufacturing becomes easy.

EXAMPLE 1

A method for manufacturing a logic circuit shown in FIG. 1 is described by referring to FIG. 10.

PEN was used for an insulating substrate 1, and Al having a thickness of 30 nm was formed on the entire surface thereof. Gate electrodes 2 were formed by photolithography and wet etching. Next, a resist pattern 3AR was formed at a place to be an opening of a gate insulator by photolithography (See FIG. 10 (a).). Next, a gate insulator 3 and an oxide semiconductor 6L were continuously formed by sputtering. The gate insulator 3 was comprised of SiON having a thickness of 500 nm. The oxide semiconductor layer 6L was comprised of InGaZnO having a thickness of 50 nm (See FIG. 10 (b).). Next, the resist was removed by dipping in a liquid for peeling, thereby an opening of the gate insulator was formed (See FIG. 10 (c)). Further, a resist was applied on the entire surface, thereafter a pattern 6R corresponding to not only as a semiconductor pattern but also over the opening of the gate insulator was formed (See FIG. 10 (d).). Next, a pattern of an oxide semiconductor 6 was formed by wet etching (See FIG. 10 (e)).

Next, ITO pattern having a thickness of 50 nm was formed as drain electrodes 5 and source electrodes 4 by a liftoff method (See FIG. 10 (f.). Finally, SiON pattern having a thickness of 200 nm was formed as a sealing layer 9 by a liftoff method (See FIG. 10 (g)).

Figure 19:
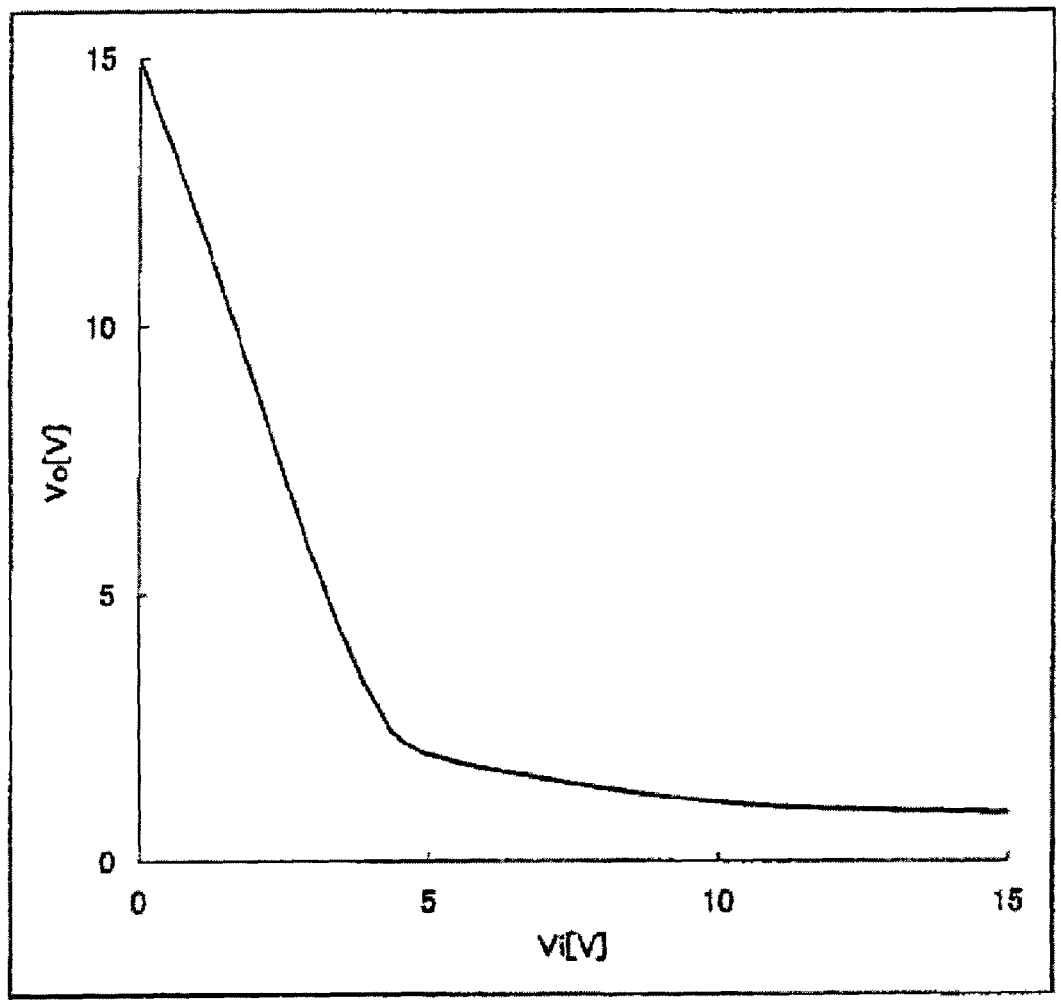
FIG. 19 is an explanatory diagram of an operating characteristic curve of an inverter in an example of the present invention.

Input-Output characteristics shown in FIG. 19 were obtained when a power source of 15 V was applied to the inverter manufactured by the above-mentioned method.

EXAMPLE 2

A method for manufacturing a logic circuit shown in FIG. 2 is described by referring to FIG. 11.

PEN was used for an insulating substrate 1, and Al having a thickness of 30 nm was formed on the entire surface thereof. Gate electrodes 2 were formed by photolithography and wet etching. Next, a resist pattern 3AR was formed at a place to be an opening of a gate insulator by photolithography (See FIG. 11 (a).). Next, a gate insulator 3 and an oxide semiconductor layer 6L were continuously formed by sputtering. The gate insulator 3 was comprised of SiON having a thickness of 500 nm. The oxide semiconductor 6L was comprised of InGaZnO having a thickness of 50 nm (See FIG. 11 (b).). Next, the resist was removed by dipping in a liquid for peeling, thereby an opening of the gate insulator was formed (See FIG. 11 (c)). Further, a resist was applied on the entire surface, thereafter a pattern 6R corresponding to not only as a semiconductor pattern but also over the opening of the gate insulator was formed (See FIG. 11 (d).). Next, a pattern of an oxide semiconductor 6 was formed by wet etching (See FIG. 11 (e)).

Next, SiON pattern having a thickness of 200 nm was formed as a sealing layer 9 by a liftoff method (See FIG. 11 (f.). Finally, ITO pattern having a thickness of 50 nm was formed as drain electrodes 5 and source electrodes 4 by photolithography and etching (See FIG. 11 (g).).

Input-Output characteristics similar to FIG. 19 were obtained when a power source of 15 V was applied to the inverter manufactured by the above-mentioned method.

EXAMPLE 3

A method for manufacturing a logic circuit shown in FIG. 3 is described by referring to FIG. 12.

PEN was used for an insulating substrate 1, and Al having a thickness of 30 nm was formed on the entire surface thereof. Gate electrodes 2 were formed by photolithography and wet etching. Next, a resist pattern 3AR was formed at a place to be an opening of a gate insulator by photolithography (See FIG. 12 (a).). Next, a gate insulator 3 and an oxide semiconductor layer 6L were continuously formed by sputtering. The gate insulator 3 was comprised of SiON having a thickness of 500 nm. The oxide semiconductor layer 6L was comprised of InGaZnO having a thickness of 50 nm (See FIG. 12 (b).). Next, the resist was removed by dipping in a liquid for peeling, thereby an opening of the gate insulator was formed (See FIG. 12 (c)). Further, a resist was applied on the entire surface, thereafter a pattern 6R corresponding to not only as a semiconductor pattern but also over the opening of the gate insulator was formed (See FIG. 12 (d).). Next, a pattern of an oxide semiconductor was formed by wet etching (See FIG. 12 (e)).

Next, SiON pattern having a thickness of 200 nm was formed as a sealing layer 9 by a liftoff method (See FIG. 12 (f).). Finally, ITO pattern having a thickness of 50 nm was formed as drain electrodes 5 and source electrodes 4 by photolithography and etching (See FIG. 12 (g).).

Input-Output characteristics similar to FIG. 19 were obtained when a power source of 15 V was applied to the inverter manufactured by the above-mentioned method.

EXAMPLE 4

A method for manufacturing TFT shown in FIG. 4 is described by referring to FIG. 13.

PEN was used for an insulating substrate, and Al having a thickness of 30 nm was formed on the entire surface thereof. A gate electrode 2, a gate wire 2', a capacitor electrode 10 and a capacitor wire 10' were formed by photolithography and wet etching (See FIG. 13 (a).). Next, SiON having a thickness of 50 nm was formed as a gate insulator 3 by sputtering (See FIG. 13 (b).) and InGaZnO having a thickness of 50 nm was formed as an oxide semiconductor 6L by sputtering. A pattern of an oxide semiconductor 6 was formed by photolithography and wet etching (See FIG. 13 (c).).

Next, ITO pattern having a thickness of 100 nm was formed as a drain electrode 5, a drain wire 5', a source electrode 4, and a pixel electrode 8 by a liftoff method (See FIG. 13 (d).). Finally, SiON pattern having a thickness of 200 nm was formed as a sealing layer 9 by a liftoff method.

Figure 20:
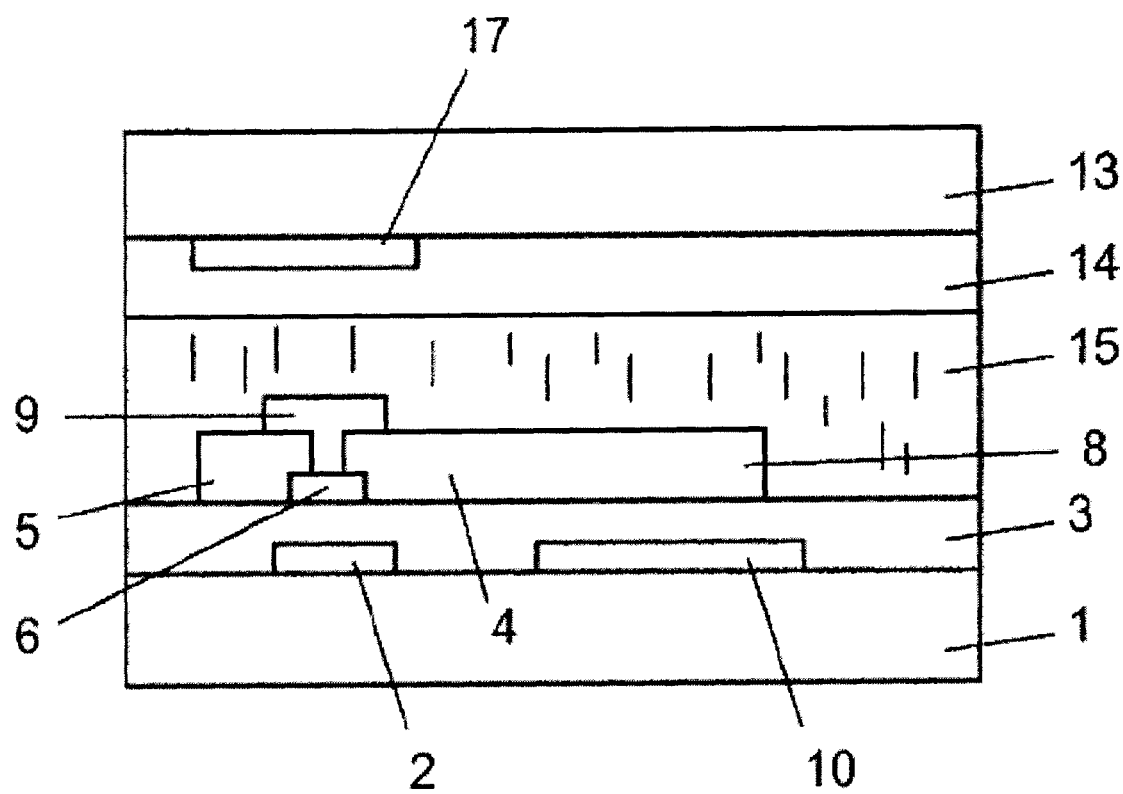
FIG. 20 is a cross-sectional view of a liquid crystal display in an example of the present invention.

A guest-host liquid crystal 15 was put between the obtained TFT array and a counter electrode (ITO) 14/a counter substrate 13 to manufacture a black-and-white liquid crystal display shown in FIG. 20. It was confirmed that the display displayed normally.

EXAMPLE 5

A method for manufacturing TFT shown in FIG. 5 is described by referring to FIG. 14.

PEN was used for an insulating substrate, and Al having a thickness of 30 nm was formed on the entire surface thereof. A gate electrode 2, a gate wire 2', a capacitor electrode 10 and a capacitor wire 10' were formed by photolithography and wet etching (See FIG. 14 (a).). Next, SiON having a thickness of 50 nm was formed as a gate insulator 3 by sputtering (See FIG. 14 (b).) and InGaZnO having a thickness of 50 nm was formed as an oxide semiconductor by sputtering. A pattern of an oxide semiconductor 6 was formed by photolithography and wet etching (See FIG. 14 (c).).

Next, SiON pattern having a thickness of 200 nm was formed as a sealing layer 9 by a liftoff method (See FIG. 14 (d).). Finally, ITO pattern having a thickness of 100 nm was formed as a drain electrode 5, a drain wire 5', a source electrode 4, and a pixel electrode 8 by photolithography and etching (See FIG. 14 (e)).

A guest-host liquid crystal 15 was put between the obtained TFT array and a counter electrode (ITO) 14/a counter substrate 13 to manufacture a black-and-white liquid crystal display shown in FIG. 20. It was confirmed that the display displayed normally.

EXAMPLE 6

A method for manufacturing TFT shown in FIG. 6 is described by referring to FIG. 15.

PEN was used for an insulating substrate, and Al having a thickness of 30 nm was formed on the entire surface thereof. A gate electrode 2, a gate wire 2', a capacitor electrode 10 and a capacitor wire 10' were formed by photolithography and wet etching (See FIG. 15 (a).). Next, SiON having a thickness of 50 nm was formed as a gate insulator 3 by sputtering (See FIG. 15 (b).) and InGaZnO having a thickness of 50 nm was formed as an oxide semiconductor by sputtering. A pattern of an oxide semiconductor 6 was formed by photolithography and wet etching (See FIG. 15 (c).).

Next, SiON pattern having a thickness of 200 nm was formed as a sealing layer 9 by a liftoff method (See FIG. 15 (d).). Finally, ITO pattern having a thickness of 100 nm was formed as a drain electrode 5, a drain wire 5', a source electrode 4, and a pixel electrode 8 by photolithography and etching (See FIG. 15 (e)).

A guest-host liquid crystal 15 was put between the obtained TFT array and a counter electrode (ITO) 14/a counter substrate 13 to manufacture a black-and-white liquid crystal display shown in FIG. 20. It was confirmed that the display displayed normally.

EXAMPLE 7

A method for manufacturing TFT shown in FIG. 7 is described by referring to FIG. 16.

PEN was used as an insulating substrate 1, and Al having a thickness of 30 nm was formed on the entire surface. A gate electrode 2, a gate wire 2', a capacitor electrode 10 and a capacitor wire 10' were formed by photolithography and wet etching (See FIG. 16 (*a*).). Next, SiON having a thickness of 500 nm was formed as a gate insulator 3 by sputtering (See FIG. 16 (*b*).) and InGaZnO having a thickness of 200 nm was formed as an oxide semiconductor by sputtering. A pattern of the oxide semiconductor 6 was formed by photolithography and wet etching (See FIG. 16 (*c*).).

Next, ITO pattern having a thickness of 50 nm was formed as a drain electrode 5, a drain wire 5', a source electrode 4, and a pixel electrode 8 by a liftoff method (See FIG. 16 (*d*).). Then, SiON pattern having (a thickness) of 20 nm was formed as a sealing layer 9 by a liftoff method (See FIG. 16 (*e*).). Further, a photosensitive acrylic material was applied to them to 20 μm, thereafter an interlayer dielectric 7 was formed by exposure and development (See FIG. 16 (O.). Finally, silver paste was printed by a screen printing, thereafter it was burned at 100☐ to make an upper pixel electrode 12 (See FIG. 16 (*g*).).

Figure 21:
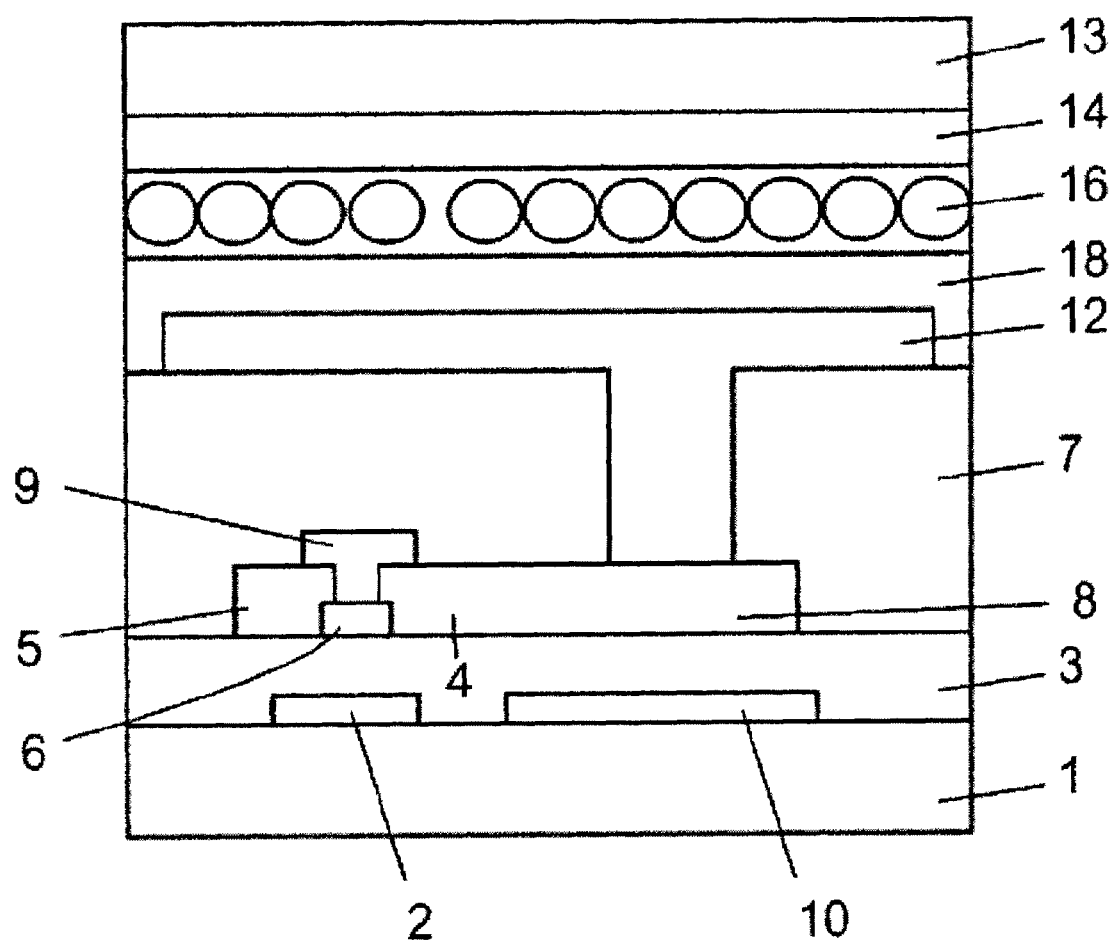
FIG. 21 is a cross-sectional view of electronic paper in an example of the present invention.

Electronic paper shown in FIG. 21 was manufactured by putting the obtained TFT array on an adhesive 18/an electrophoretic capsule 16/a counter electrode (ITO) 14/a counter substrate 13. It was confirmed that the display displayed normally.

EXAMPLE 8

A method for manufacturing TFT shown in FIG. 8 is described by referring to FIG. 17.

PEN was used as an insulating substrate 1, and Al having a thickness of 30 nm was formed on the entire surface. A gate electrode 2, a gate wire 2', a capacitor electrode 10, and a capacitor wire 10' were formed by photolithography and wet etching (See FIG. 17 (*a*).). Next, SiON having a thickness of 500 nm was formed as a gate insulator 3 by sputtering (See FIG. 17 (*b*).) and InGaZnO having a thickness of 200 nm was formed as an oxide semiconductor by sputtering. A pattern of the oxide semiconductor 6 was formed by photolithography and wet etching (See FIG. 17 (*c*).).

Next, SiON pattern having a thickness of 200 nm was formed as a sealing layer 9 by a liftoff method (See FIG. 17 (*d*)). Then, ITO pattern having a thickness of 50 nm was formed as a drain electrode 5, a drain wire 5', a source electrode 4, and a pixel electrode 8 by photolithography and etching (See FIG. 17 (*e*)). Further, a photosensitive acrylic material was applied to them to 20 μm, thereafter an interlayer dielectric 7 was formed by exposure and development (See FIG. 17 (*f*).). Finally, silver paste was printed by a screen printing, thereafter it was burned at 100☐ to make an upper pixel electrode 12 (See FIG. 17 (*g*).).

Electronic paper shown in FIG. 21 was manufactured by putting the obtained TFT array on an adhesive 18/an electrophoretic capsule 16/a counter electrode (ITO) 14/a counter substrate 13. It was confirmed that the display displayed normally.

EXAMPLE 9

A method for manufacturing TFT shown in FIG. 9 is described by referring to FIG. 18.

PEN was used as an insulating substrate 1, and Al having a thickness of 30 nm was formed on the entire surface. A gate electrode 2, a gate wire 2', a capacitor electrode 10, and a capacitor wire 10' were formed by photolithography and wet etching (See FIG. 18 (*a*).). Next, SiON having a thickness of 500 nm was formed as a gate insulator 3 by sputtering (See FIG. 18 (*b*).) and InGaZnO having a thickness of 200 nm was formed as an oxide semiconductor by sputtering. A pattern of the oxide semiconductor 6 was formed by photolithography and wet etching (See FIG. 18 (*c*).).

Next, SiON pattern having a thickness of 200 nm was formed as a sealing layer 9 by a liftoff method (See FIG. 18 (*d*)). Then, ITO pattern having a thickness of 50 nm was formed as a drain electrode 5, a drain wire 5', a source electrode 4, and a pixel electrode 8 by photolithography and etching (See FIG. 18 (*e*)). Further, a photosensitive acrylic material was applied to them to 20 μm, thereafter an interlayer dielectric 7 was formed by exposure and development (See FIG. 18 (*f*).). Finally, silver paste was printed by a screen printing, thereafter it was burned at 100☐ to make an upper pixel electrode 12 (See FIG. 18 (*g*).).

An electronic paper shown in FIG. 21 was manufactured by putting the obtained TFT array on an adhesive 18/an electrophoretic capsule 16/a counter electrode (ITO) 14/a counter substrate 13. It was confirmed that the display displayed normally.

EXAMPLE 10

The performance of a sealing layer 9 was evaluated.

A sealing layer 9 was formed by reactive sputtering of SiON. Flow rate of $O_2$ was 5% base on the flow rate of all gases. Even if a photosensitive acrylic resin was applied thereto, a change of a threshold value of TFT was within ±2V. In addition, the condition of SiON reactive sputtering was as follows: pressure 0.5 Pa; flow rate of Ar 38 sccm; flow rate of $O_2$ 2 sccm; electric power 300 W; and a film thickness of 200 nm.

EXAMPLE 11

A sealing layer 9 was formed by reactive sputtering of SiON. Flow rate of $O_2$ was 10% base on the flow rate of all gases. Even if a photosensitive acrylic resin was applied thereto, a change of a threshold value of TFT was within ±2V. In addition, the condition of SiON reactive sputtering was as follows: pressure 0.5 Pa; flow rate of Ar 36 sccm; flow rate of $O_2$ 4 sccm; electric power 300 W; and a film thickness of 200 nm.

EXAMPLE 12

A sealing layer 9 was formed by reactive sputtering of SiON. Flow rate of $O_2$ was 20% base on the flow rate of all gases. Even if a photosensitive acrylic resin was applied thereto, a change of a threshold value of TFT was within ±2V. In addition, the condition of SiON reactive sputtering was as follows: pressure 0.5 Pa; flow rate of Ar 32 sccm; flow rate of $O_2$ 8 sccm; electric power 300 W; and a film thickness of 200 nm.

EXAMPLE 13

In a case where a fluorinated polymer (CYTOP, a product of ASAHI GLASS co., LTD.) was used for a sealing layer 9, even if a photosensitive acrylic resin was applied thereto, a change of a threshold value of TFT was within ±2V.

Hereinafter, Comparative Examples are described.

COMPARATIVE EXAMPLE 1

In a case of no sealing layer 9, if a photosensitive acrylic resin was applied thereto, a change of a threshold value of TFT was −30 V.

COMPARATIVE EXAMPLE 2

Sputtering of SiN was performed for a sealing layer 9. After having formed the sealing layer, the sealing layer 9 was peeled off. This was because the stress inside a sealing layer 9 was too large. In addition, the condition of sputtering of SiN was as follows: pressure 0.5 Pa; flow rate of Ar 40 sccm; electric power 300 W; and a film thickness of 200 nm.

(The disclosure of Japanese Patent Application No. JP2006-126320, filed on Apr. 28, 2006, is incorporated herein by reference in its entirety)

What is claimed is:

1. A thin film transistor, comprising:
   a gate electrode formed on an insulating substrate;
   a gate wire connected to said gate electrode;
   a capacitor electrode;
   a capacitor wire connected to said capacitor electrode, wherein said gate wire, said capacitor electrode and said capacitor wire are in the same layer as said gate electrode;
   a gate insulator formed on said gate electrode;
   an oxide semiconductor pattern formed on said gate insulator;
   a sealing layer formed on said oxide semiconductor pattern;
   a drain electrode and a source electrode formed on said sealing layer, wherein said sealing layer does not cover a connection part of said source electrode and a connection part of said drain electrode, and wherein said drain electrode and said source electrode are connected to said oxide semiconductor pattern via said connection part of said drain electrode and said connection part of said source electrode;
   a drain wire connected to said drain electrode; and
   a pixel electrode connected to said source electrode, said drain wire and said pixel electrode being in the same layer as said drain electrode and said source electrode.

2. The thin film transistor according to claim 1, wherein said sealing layer is made of oxide nitride silicon.

3. The thin film transistor according to claim 1, wherein said sealing layer is a fluorinated polymer.

4. A thin film transistor, comprising:
   a gate electrode formed on an insulating substrate;
   a gate wire connected to said gate electrode;
   a capacitor electrode;
   a capacitor wire connected to said capacitor electrode, wherein said gate wire, said capacitor electrode and said capacitor wire are in the same layer as said gate electrode;
   a gate insulator formed on said gate electrode;
   an oxide semiconductor pattern formed on said gate insulator;
   a sealing layer formed on said oxide semiconductor pattern;
   a drain electrode and a source electrode formed on said sealing layer, wherein said sealing layer does not cover a connection part of said source electrode and a connection part of said drain electrode, and wherein said drain electrode and said source electrode are connected to said oxide semiconductor pattern via said connection part of said drain electrode and said connection part of said source electrode;
   a drain wire connected to said drain electrode;
   a pixel electrode connected to said source electrode, said drain wire and said pixel electrode being in the same layer as said drain electrode and said source electrode;
   an interlayer dielectric having an opening on said pixel electrode and formed on said sealing layer, and
   an upper pixel electrode connected to said pixel electrode through said opening and formed on said interlayer dielectric.

5. The thin film transistor according to claim 4, wherein said sealing layer is made of oxide nitride silicon.

6. The thin film transistor according to claim 4, wherein said sealing layer is a fluorinated polymer.

7. The thin film transistor according to claim 5, wherein said interlayer dielectric is a non-fluorinated polymer.

8. The thin film transistor according to claim 6, wherein said interlayer dielectric is a non-fluorinated polymer.

* * * * *